(12) United States Patent
Marshall et al.

(10) Patent No.: US 6,353,841 B1
(45) Date of Patent: Mar. 5, 2002

(54) RECONFIGURABLE PROCESSOR DEVICES

(75) Inventors: Alan David Marshall; Anthony Stansfield, both of Bristol (GB); Jean Vuillemin, Paris (FR)

(73) Assignee: Elixent, Ltd. (GB)

( * ) Notice: Subject to any disclaimer, the term of this patent is extended or adjusted under 35 U.S.C. 154(b) by 0 days.

(21) Appl. No.: 09/209,542

(22) Filed: Dec. 11, 1998

(30) Foreign Application Priority Data

Dec. 17, 1997 (EP) .............................................. 97310220
Jun. 2, 1998 (GB) .............................................. 9811776

(51) Int. Cl.[7] ................................................. G06F 7/48
(52) U.S. Cl. ....................................................... 708/232
(58) Field of Search ................................. 708/232, 230; 326/39, 38

(56) References Cited

U.S. PATENT DOCUMENTS

| | | | |
|---|---|---|---|
| 4,236,204 A | 11/1980 | Groves | 364/200 |
| 4,698,751 A | * 10/1987 | Parvin | 712/19 |
| 4,766,566 A | 8/1988 | Chuang | 712/23 |
| 4,775,952 A | * 10/1988 | Danielsson et al. | 708/524 |
| 5,204,556 A | 4/1993 | Shankar | 307/465.1 |
| 5,208,491 A | 5/1993 | Ebeling et al. | 307/465 |
| 5,233,539 A | 8/1993 | Agrawal et al. | 364/489 |
| 5,291,431 A | 3/1994 | Ho et al. | 364/760 |
| 5,426,379 A | 6/1995 | Trimberger | 326/39 |
| 5,457,644 A | * 10/1995 | McCollum | 708/232 |
| 5,498,975 A | 3/1996 | Cliff et al. | 326/10 |
| 5,568,646 A | 10/1996 | Jagger | 395/800 |
| 5,583,450 A | 12/1996 | Trimberger et al. | 326/41 |
| 5,586,277 A | 12/1996 | Brown et al. | 712/210 |
| 5,621,694 A | 4/1997 | Sakugawa et al. | 365/230 |
| 5,680,597 A | 10/1997 | Kumar et al. | 395/567 |
| 5,835,746 A | 11/1998 | Girardeau, Jr. et al. | 395/391 |
| 5,923,612 A | 7/1999 | Park et al. | 365/233 |
| 6,188,240 B1 | * 2/2001 | Nakaya | 708/232 |

FOREIGN PATENT DOCUMENTS

| | | |
|---|---|---|
| WO | 95/22205 | 8/1995 |
| WO | 97/46948 | 12/1997 |

OTHER PUBLICATIONS

"The Thumb Architecture," Advanced RISC Machines Limited Specification, pp. 1–2, (1995).

(List continued on next page.)

*Primary Examiner*—David H. Malzahn
(74) *Attorney, Agent, or Firm*—Lyon & Lyon LLP

(57) ABSTRACT

The invention relates to a reconfigurable device comprising a plurality of processing devices, a connection matrix providing an interconnect between the processing devices, and means to define the configuration of the connection matrix. Each of the processing devices comprises an arithmetic logic unit, which is adapted to perform a function on input operands and produce an output. The input operands are provided as inputs to the arithmetic logic unit from the interconnect on the same route in each cycle. Dynamic instructions are enabled by means provided to route the output of a first one of the processing devices to a second one of the processing devices to determine the function performed by the second one of the processing devices.

33 Claims, 13 Drawing Sheets-

OTHER PUBLICATIONS

Patterson, D.A., et al., *Computer Architecture: A Quantitative Approach*, San Mateo, California: Morgan Kaufman Publishers, Inc., Chapter 4.5: pp. 160–166, Appendix E: pp. E–1–E–24, (1995).

Chen, D.C., et al., "A Reconfigurable Multiprocessor IC for Rapid Prototyping of Real–Time Data Paths," IEEE International Solid–State Circuits Conference, pp. 74–75, (Feb. 1992).

Yeung, A.K., et al., "A Data–Driven Multiprocessor Architecture (PADD12) for Irregular Computation–Intensive DSP Algorithms," IEEE VLSI Signal Processing Workshop, pp. 1–5 (Oct. 1992).

Mirsky, E., et al., "MATRIX: A Reconfigurable Computing Architecture with Configurable Instruction Distribution and Deployable Resources," FCCM '96: IEEE Symposium on FPGAs for Custom Computing Machines, Apr. 17–19, 1996, Napa, California, USA pp. 1–10.

DeHon, A., "Reconfigurable Architectures for General–Purpose Computing," Technical Report 1586, MIT Artificial Intelligence Laboratory, pp. 257–296.

Koren, I., "High–Speed Multiplication," *Computer Arithmetic Algorithms*, Englewood Cliffs, New Jersey: Prentice Hall, pp. 99–103, (1993).

Hartle, R.I., et al., "The serial–serial bit . . . ," *Digital–Serial Computation*, Norwell USA: Kluwer Academic Publishing, pp. 1–2, (1995).

D. Bursky "Gate Arrays Face Onslaught of Dense and Flexible FPGA's", *Electronic Design*, vol. 43, No. 13, Jun. 26, 1995, pp. 85–86, 88, 90, 94, and 96.

D. Bursky, "SRAM Blocks and Antifuse Logic Combine In New FPGA's", *Electronic Design*, vol. 43, No. 16, Aug. 7, 1995, pp. 115, 116, and 118.

G. Borriello, et al. "The Triptych FPGA Architecture", *IEEE Transactions On Very Large Scale Integration (VLSI) Systems*, vol. 3, No. 4, Dec., 1995, pp. 491–500.

Patent abstract of Japan, vol. 006, No. 104 (P–122), Jun. 15, 1982 (Abstract of Japanese Patent Document No. JP 57 036347 A (NEC Corp.), Feb. 27, 1982).

Patent abstract of Japan, vol. 007, No. 073 (P–186), Mar. 25, 1983 (Abstract of Japanese Patent Document No. JP 58 003040 A (NEC Corp.), Jan. 8, 1983.

Paneerselvam, G., et al., "Design and Implementation of an Area and Time Efficient Systolic Parallel Booth Multiplier", Proceedings of the Midwest Symposium on Circuits and Systems, Detroit, Aug. 16–18, 1993, vol. 2, No. Symp. 36, Aug. 16, 1993, pp. 1497–1500, *Institute of Electrical and Electronics EngineerS*, see paragraph 3.

Balsara, P.T., et al., "Understanding VLSI Bit Serial Multipliers", *IEEE Transactions On Education*, vol. 39, No. 1, Feb. 1, 1996, pp. 19–28, see paragraph II–V.

Dadda, L., "On Serial–Input Multipliers for Two's Compliment Numbers", *IEEE Transactions On Computers*, vol. 38, No. 9, Sep. 1989, pp. 1341–1345, see paragraph III.

Satyanarayana, et al., "A Comprehensive Approach to the Design of Digit–Serial Modified Booth Multipliers", *Proc. 26Th Southeastern Symp. On System Theory*, 1994, pp. 229–233, see paragraph 3.

Wo, et al., "Exploiting Neural Network Parallelism", *1st Int. Workshop in Parallel Processing*, 1994, pp. 586–592, see paragraph 3.

\* cited by examiner

RECONFIGURABLE PROCESSOR DEVICES

BACKGROUND AND SUMMARY OF THE INVENTION

The present invention relates to a reconfigurable processor device.

A conventional processor (such as, for example, the Pentium II produced by Intel Corp.—Pentium is a trademark of Intel Corp.) is a general purpose device. It is not optimised for any specific task, but is instead able to be programmed to perform a very wide range of functions.

The consequence of the general purpose architecture of the conventional processor is that for specific tasks, the performance of the processor will be much worse than for hardware designed to perform the specific tasks. This is because the architecture of the general purpose processor does not follow the structure of the task, but instead relies on a complex ALU (arithmetic logic unit) which is very heavily used during the task and which makes very frequent calls to its necessarily large memory resources. Where such tasks are computationally intensive, this approach is particularly inappropriate.

If there is a task which will be need to be performed on a regular basis, then an appropriate approach will be to provide circuitry optimised specifically for that task. A typical approach is to provide such circuitry in the form of a co-processor or ASIC (application specific integrated circuit) together with the general-purpose processor, so that the tasks for which the co-processor or ASIC is optimised can be routed to the co-processor or ASIC by the general-purpose processor.

Although an ASIC may be optimal for a specific task, as it has been built for one specific task it will generally be poor or entirely non-functional for any other computational task. An advantageous possibility exists between the two extremes: on the one hand, a fixed configuration ASIC, and on the other hand, a conventional processor (for which a "configuration" in silicon can only be considered to exist for a single cycle). This intermediate possibility is a reconfigurable device: these have a determined configuration but allow for reconfiguration to a different determined configuration when required. Reconfigurable devices thus offer the possibility of a computer which can alter its hardware resources to service its current computational needs by appropriate reconfiguration.

A commercially successful form of reconfigurable device is the field-programmable gate array (FPGA). These devices consist of a collection of configurable processing elements embedded in a configurable interconnect network. Configuration memory is provided to describe the interconnect configuration—often SRAM is used. These devices have a very fine-grained structure: typically each processing element of an FPGA is a configurable gate. Rather than being-concentrated in a central ALU, processing is thus distributed across the device and the silicon area of the device is used more effectively. An example of a commercially available FPGA series is the Xilinx 4000 series.

Such reconfigurable devices can in principle be used for any computing application for which a processor or an ASIC is used. However, a particularly suitable use for such devices is as a coprocessor to handle tasks which are computationally intensive, but which are not so common as to merit a purpose built ASIC. A reconfigurable coprocessor could thus be programmed at different times with different configurations, each adapted for execution of a different computationally intensive task, providing greater efficiency than for a general purpose processor alone without a huge increase in overall cost. In recent FPGA devices, scope is provided for dynamic reconfiguration, wherein partial or total reconfiguration can be provided during the execution of code so that time-multiplexing can be used to provide configurations optimised for different subtasks at different stages of execution of a piece of code.

FPGA devices are not especially suitable for certain kinds of computational task. As the individual computational elements are very small, the datapaths are extremely narrow and many of them are required, so a large number of operations are required in the configuration process. Although these structures are relatively efficient for tasks which operate on small data elements and are regular from cycle to cycle, they are less satisfactory for irregular tasks with large data elements. Such tasks are also often not well handled by a general purpose processor, yet may be of considerable importance (such as in, for example, image processing). Alternative reconfigurable architectures have been proposed. One example is the PADDI architecture developed by the University of California at Berkeley, described in D. Chen and J. Rabaey, "A Reconfigurable Multiprocessor IC for Rapid Prototyping of Real Time Data Paths", ISSCC, February 1992 and A. Yeung and J. Rabaey, "A Data-Driven Architecture for Rapid Prototyping of High Throughput DSP Algorithms", IEEE VLSI Signal Processing Workshop, October 1992. This architecture was directed to the prototyping of high speed real-time DSP systems, DSP algorithms providing an example of computation not well handled either by conventional processors or FPGAs. The architecture comprises a plurality of relatively simple processing execution units connected by a reconfigurable network. Each execution unit operates at 16 bit width, has register files for the input operands, and has its own instruction memory. A 53 bit instruction word is necessary to specify the operation of an instruction unit.

In PADDI, instructions are distributed both at configuration and at run time. At configuration time, the memories, which act as control stores, are loaded with a set of instructions. At run time the addresses for all of the control stores are broadcast globally, and each of these local instruction memories retrieves its own local instruction for use by the local execution unit. In operation, communication between processing elements is data driven, and the processing elements act on data according to their local instructions.

Another alternative architecture is MATRIX, developed at the Massachussetts Institute of Technology and described in Ethan Mirsky and Andre deHon, "MATRIX: A Reconfigurable Computing Architecture with Configurable Instruction Distribution and Deployable Resources", FCCM '96— IEEE Symposium on FPGAs for Custom Computing Machines, April 17–19, 1996, Napa, Calif. USA, and in more detail in Andre deHon, "Reconfigurable Architectures for General-Purpose Computing", pages 257 to 296, Technical Report 1586, MIT Artificial Intelligence Laboratory. MATRIX is a coarse-grained structure, in which an array of identical 8-bit functional units are interconnected with a configurable network. Each functional unit contains a 256× 8-bit memory, an 8-bit ALU with address able input registers, an output register and a multiplier, and control logic. This architecture is relatively versatile, as it provides the decentralisation of processing of an FPGA while providing a broader datapath and the scope to adjust the instruction stream to what is required for a given application.

The MATRIX structure has advantageous aspects, but the coarse grain size means that it consumes more silicon than a conventional FPGA structure and is likely to be less efficient for tasks which are regular from cycle to cycle. It would therefore be desirable to develop further reconfigurable structures which combine as best possible the advantages of both MATRIX and of conventional FPGAs.

Accordingly, the invention provides a reconfigurable device comprising: a plurality of processing devices; a connection matrix providing an interconnect between the processing devices; and means to define the configuration of the connection matrix; wherein each of the processing devices comprises an arithmetic logic unit adapted to perform a function on input operands and produce an output, wherein said input operands are provided as inputs to the arithmetic logic unit from the interconnect on the same route in each cycle, and wherein means are provided to route the output of a first one of the processing devices to a second one of the processing devices to determine the function performed by the second one of the processing devices.

Unlike MATRIX, this approach involves no addressable input register (and hence no input register file), because input operands are provided from the interconnect on the same route in each cycle. This requires that individual processing devices are used as a part of a processing pipeline (conceivably it can return instructions to itself, but it will need to do this through the interconnect). An individual processing device in MATRIX is thus capable of a fuller range of function than an individual processing device in the reconfigurable device according to the invention. However, this is more than compensated for by the increased number of processing devices for a given area of silicon.

The present approach also does not involve the sacrifice of considerable silicon area to form the control store memory needed for the PADDI architecture: this control store needs to be a significant size in PADDI, and the execution units of PADDI will be of much larger size than those of the present invention for equivalent functionality. The control store will also often be redundant in the PADDI architecture (if the execution unit is only required to perform the same instruction on every cycle). The requirement in PADDI that all control stores are addressed by a single global address prevents different parts of the machine being sequenced in data dependent ways, or operating on different threads of computation: in the PADDI arrangement, all the execution units must execute in synchronism.

It should be noted that input registers are not necessarily absent from architectures of this type: input registers which are not addressable are consistent with the invention (as input operands are still received on the same route in each cycle and the ALUs must be used in a processing pipeline). However, in a preferred embodiment none of the processing devices contains an input register of any kind, so input operands are received directly from the interconnect by the arithmetic logic unit.

The processing devices need configuration to perform appropriate functions, and at least some measure of dynamic instruction provision is to be provided. An advantageous solution is that each of the processing devices has a first plurality of configuration bits which can be determined by the output of another one of the processing devices and a second plurality of configuration bits which cannot be determined by the output of another one of the processing devices.

In a preferred embodiment, each of the processing devices has a first operand input, a second operand input, a function result output, a carry input and a carry output, wherein the first operand input, the second operand input and the function result output are n-bit, where n is an integer greater than 1, and the carry input and the carry output are 1-bit. A particularly good design solution is found when n is equal to 4.

In a preferred embodiment the mechanism for dynamic instruction is that each of the processing devices is adapted to receive, for determination of its function, an n-bit instruction input from another of the processing devices.

A further advantageous way to provide dynamic instruction is by provision of means to allow the carry input to one of the processing devices to change the function of the arithmetic logic unit of that processing device (for example to allow the carry input to change the function of the arithmetic logic unit to its logical complement). However, for versatile operation, it is also advantageous that means are provided for each of the processing devices to hold the carry input as a constant value. A further advantageous approach is for a first one of the processing devices to be usable to multiplex between two values of an instruction input to a second one of the processing devices according to the value of the carry input of the first of the processing devices, optionally also such that the carry input of the first of the processing devices can be propagated through the first of the processing devices to the carry input of the second of the processing devices.

It is also advantageous that each of the processing devices contains a latchable output register for the function output. This is useful for constructing a "deep" pipeline, where for example it is necessary to perform a number of operations in parallel and synchronise the provision of output from different ALUs.

To allow an individual device to accept or reject dynamic instructions, it is desirable to provide for each of the processing devices a dynamic enable gate to determine whether instructions to determine the function of the arithmetic logic unit are to be accepted dynamically from the interconnect or are to be provided from configuration memory in the processing device. A further advantageous feature for each processing device is a dynamic instruction mask whereby application of the dynamic instruction mask to an instruction received by the processing device enables the instruction to provide both an instruction input to the arithmetic logic unit for determining the function of the arithmetic logic unit and an peripheral circuitry instruction input for control of peripheral circuitry in the processing device.

BRIEF DESCRIPTION OF THE DRAWINGS

Specific embodiments of the invention are described below, by way of example, with reference to the accompanying drawings, in which.

DETAILED DESCRIPTION OF THE PREFERRED EMBODIMENTS

In the following description, the terms "horizontal", "vertical", "North", "South", "East" and "West" have been used to assist in an understanding of relative directions, but their use is not intended to imply any restriction on the absolute orientation of the embodiment of the invention.

The processor array for the embodiment of the invention is provided in an integrated circuit. At one level, the processor array is formed by a rectangular (and preferably square) array of "tiles" 10, one of which is shown bounded by a thick line in FIG. 1. Any appropriate number of tiles may be employed, for example in a 16×16, 32×32 or 64×64 array. Each tile 10 is rectangular and is divided into four circuit areas. It is preferable for these tiles to be logically square (to provide symmetry in connection), although it is of less significance that they be physically square (this may have some advantage in providing symmetry in timing, but this will generally be less likely to be of significance). Two of the circuit areas 12, which are diagonally opposed in the tile 10, provide the locations for two arithmetic logic units ("ALUs"). The other two circuit areas, which are diagonally opposed in the tile 10, provide the locations for a pair of switching sections 14.

Figure 1:
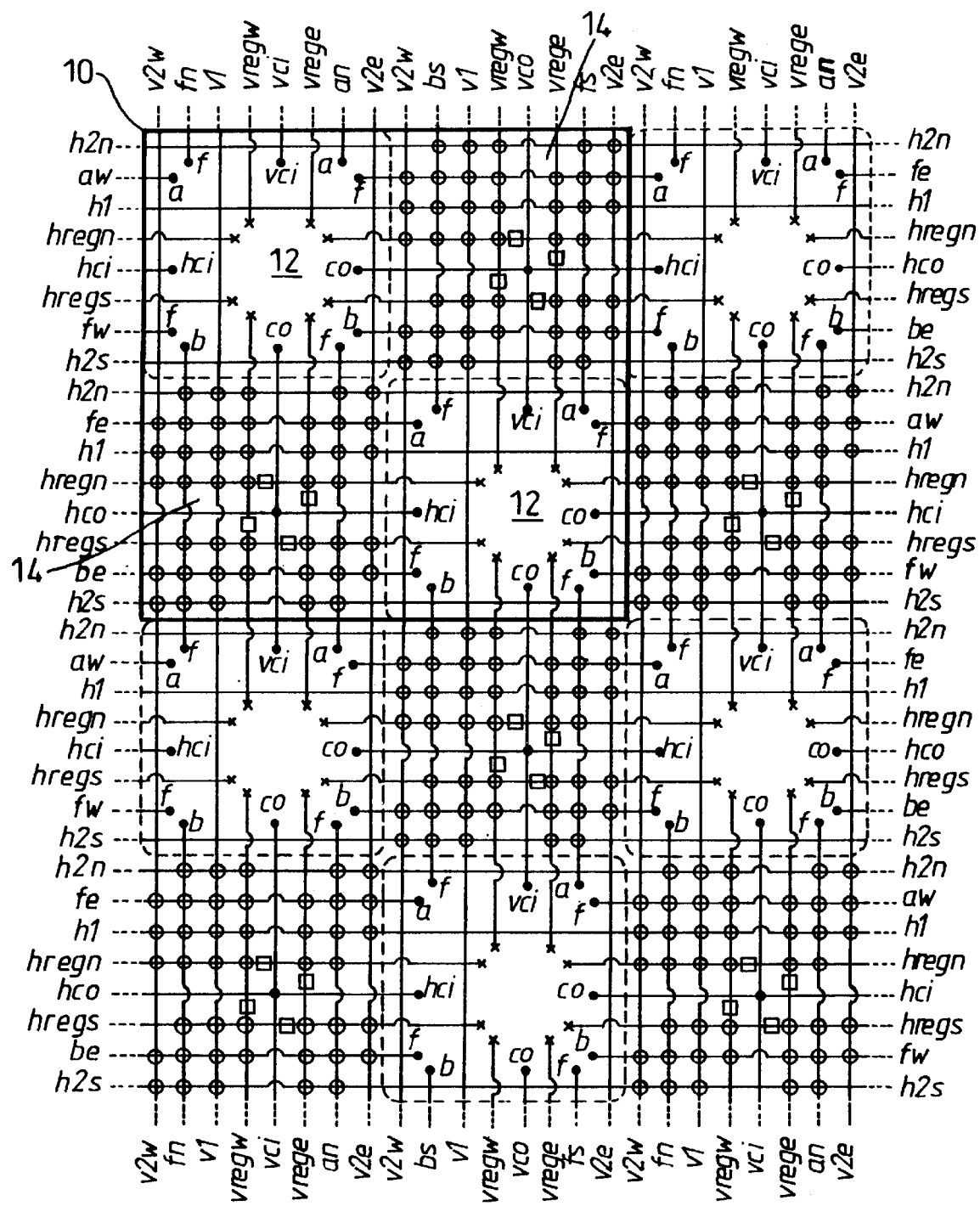
FIG. 1 shows part of a processor array, illustrating six switching sections and the locations of six arithmetic logic units.
Figure 2:
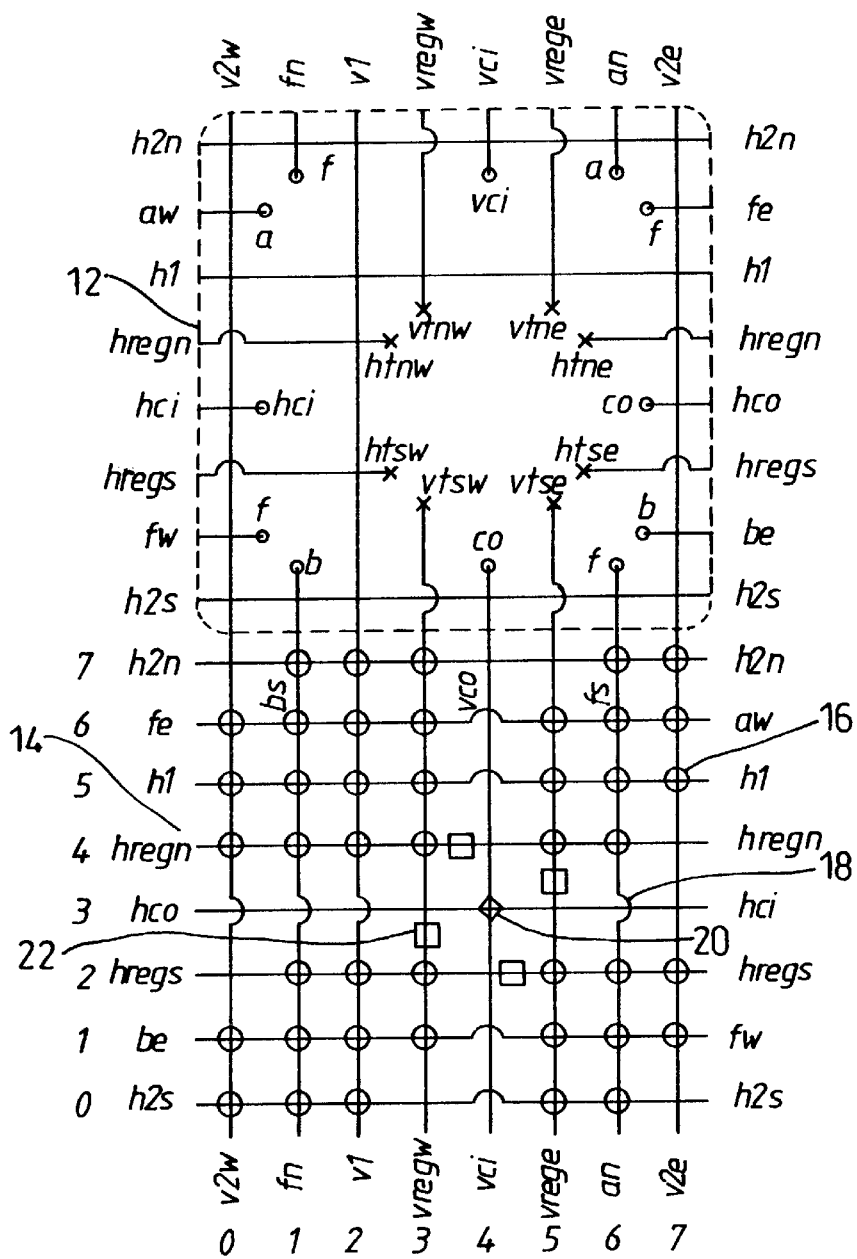
FIG. 2 is a diagram of part of the arrangement shown in FIG. 1 on a larger scale, illustrating one of the switching sections and one of the locations of the arithmetic logic units.

Referring to FIGS. 1 and 2, each ALU has a first pair of 4-bit inputs a, which are directly connected within the ALU, a second pair of 4-bit inputs b, which are also directly connected within the ALU, and four 4-bit outputs f, which are directly connected within the ALU. Each ALU also has an independent pair of 1-bit carry inputs hci, vci, and a pair of 1-bit carry outputs co, which are directly connected within the ALU. The ALU can perform standard operations on the input signals a, b, hci, vci to produce the output signals f, co, such as add, subtract, AND, NAND, OR, NOR, XOR, NXOR and multiplexing and optionally can register the result of the operation. The operation of an individual ALU is discussed in greater detail below. The instructions to the ALUs may be provided from respective 4-bit memory cells whose values can be set via the "H-tree" structure described below, or may be provided on the bus system which will be described below.

Figure 6A:
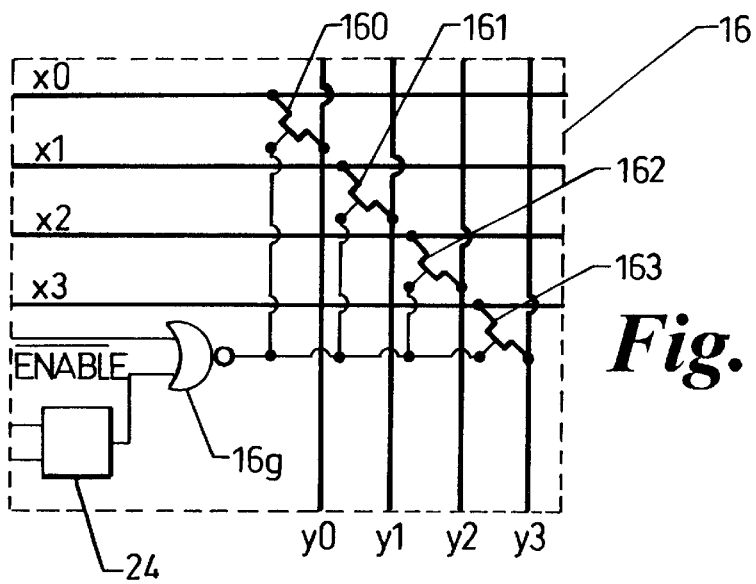
FIG. 6A shows in detail the circuitry of one type of programmable switch in the switching sections, for connecting a pair of 4-bit busses which cross each other.
Figure 6B:
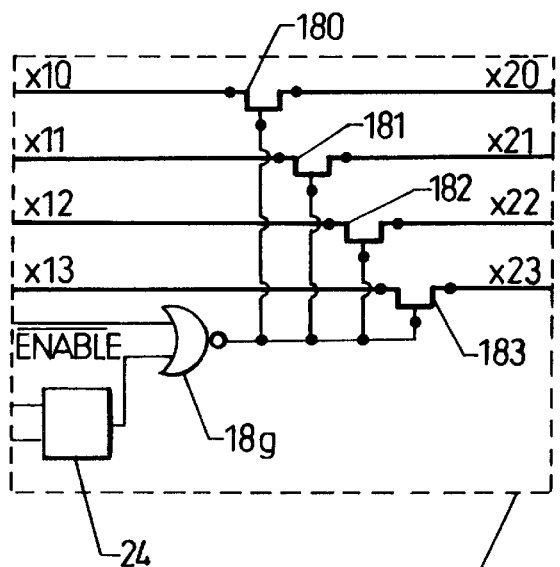
FIG. 6B shows in detail the circuitry of another type of programmable switch in the switching sections, for connecting a pair of 4-bit busses which meet each other end to end.
Figure 6C:
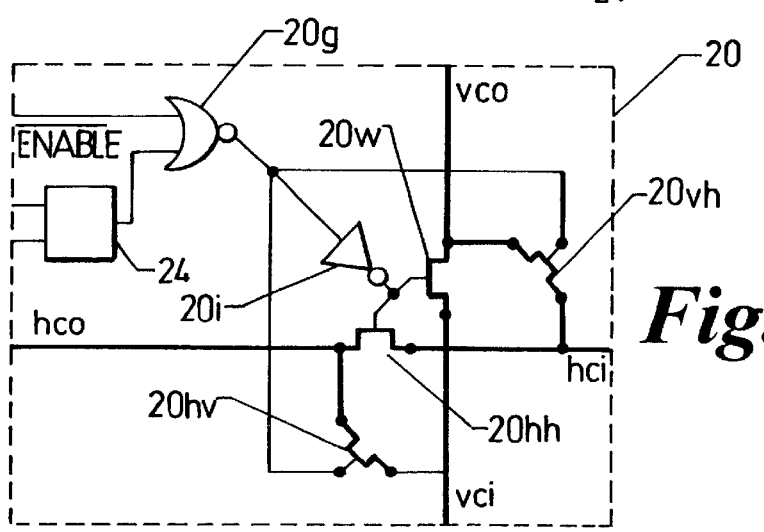
FIG. 6C shows in detail the circuitry of another type of programmable switch in the switching sections, for connecting carry-bit busses.

At the level shown in FIGS. 1 and 2, each switching section 14 has eight busses extending across it horizontally, and eight busses extending across it vertically, thus forming an 8×8 rectangular array of 64 crossing points, which have been numbered in FIG. 2 with Cartesian co-ordinates. All of the busses have a width of four bits, with the exception of the carry bus vc at X=4 and the carry bus hc at Y=3, which have a width of one bit. At many of the crossing points, a 4-gang programmable switch 16 is provided which can selectively connect the two busses at that crossing point. At some of the crossing points, a 4-gang programmable switch 18 is provided which can selectively connect two busses which meet end to end at that crossing point, without any connection to the bus at right angles thereto. At the crossing point at (4, 3), a programmable switch 20 (for example as shown in FIG. 6C) is provided which can selectively connect the carry busses vc, hc which cross at right angles at that point.

The horizontal busses in the switching section 14 will now be described.

At Y=0, busses h2s are connectable by programmable switches 16 to the vertical busses at X=0, 1, 2, 5, 6. The busses h2s have a length of two tiles and are connectable end to end in every other switching section 14 by a programmable switch 18 at (4, 0).

At Y=1, a bus be extending from an input b of the ALU to the West is connectable by switches 16 to the vertical busses at X=0, 1, 2, 3. Also, a bus fw extending from an output f of the ALU to the East is connectable by switches 16 to the vertical busses at X=5, 6, 7. The ends of the busses be, fw are connectable by a programmable switch 18 at (4, 1). At Y=2, a bus hregs is connectable by programmable switches 16 to the vertical busses at X=1, 2, 3, 5, 6, 7.

At Y=3, a bus hco extends from the carry output co of the ALU to the West to a programmable switch 20 at (4, 3), which can connect the bus hco (a) to a carry bus hci extending to the carry input hci of the ALU to the East or (b) to a carry bus vci extending to the carry input vci of the ALU to the South.

At Y=4, a bus hregn is connectable by programmable switches 16 to the vertical busses at X=0, 1, 2, 3, 5, 6.

At Y=5, busses h1 are connectable to the vertical busses at X=0, 1, 2, 3, 5, 6, 7. The busses h1 have a length of one tile and are connectable end to end in each switching section 14 by a programmable switch 18 at (4, 5).

At Y=6, a bus fe extending from an output f of the ALU to the West is connectable by switches 16 to the vertical busses at X=0, 1, 2, 3. Also, a bus aw extending from an input a of the ALU to the East is connectable by switches 16 to the vertical busses at X=5, 6, 7. The ends of the busses fe, aw are connectable by a programmable switch 18 at (4, 6).

At Y=7, busses h2n are connectable by programmable switches 16 to the vertical busses at X=1, 2, 3, 6, 7. The busses h2n have a length of two tiles and are connectable end to end in every other switching section 14 by a programmable switch 18 at (4, 7), staggered with respect to the programmable switches 18 connecting the busses h2s at (4, 0).

The vertical busses in the switching section 14 will now be described.

At X=0, busses v2w are connectable by programmable switches 16 to the horizontal busses at Y=0, 1, 4, 5, 6. The busses v2w have a length of two tiles and are connectable end to end in every other switching section 14 by a programmable switch 18 at (0, 3).

At X=1, a bus fn extending from an output f of the ALU to the South is connectable by programmable switches 16 to the horizontal busses at Y=0, 1, 2. Also, a bus bs extending from an input b of the ALU to the North is connectable by switches 16 to the horizontal busses at Y=4, 5, 6, 7. The ends of the busses fn, bs are connectable by a programmable switch 18 at (1, 3).

At X=2, busses v1 are connectable to the horizontal busses at Y=0, 1, 2, 4, 5, 6, 7. The busses v1 have a length of one tile and are connectable end to end in each switching section 14 by a programmable switch 18 at (2, 3).

At X=3, a bus vregw is connectable by programmable switches 16 to the horizontal busses at Y=1, 2, 4, 5, 6, 7.

At X=4, a bus vco extends from the carry output co of the ALU to the North to the programmable switch 20 at (4, 3), which can connect the bus vco (a) to the carry bus hci extending to the carry input hci of the ALU to the East or (b) to the carry bus vci extending to the carry input vci of the ALU to the South.

At X=5, a bus vrege is connectable by programmable switches 16 to the horizontal busses at Y=0, 1, 2, 4, 5, 6.

At X=6, a bus an extending from an input a of the ALU to the South is connectable by switches 16 to the horizontal busses at Y=0, 1, 2. Also, a bus fs extending from an output f of the ALU to the North is connectable by programmable switches 16 to the horizontal busses at Y=4, 5, 6, 7. The ends of the busses an, fs are connectable by a programmable switch 18 at (6, 3).

At X=7, busses v2e are connectable by programmable switches 16 to the horizontal busses at Y=1, 2, 5, 6, 7. The busses v2e have a length of two tiles and are connectable end to end in every other switching section 14 by a programmable switch 18 at (7, 3) staggered with respect to the programmable switches 18 connecting the busses v2w at (0, 3).

As shown in FIG. 2, the busses bs, vco, fs are connected to input b, output co and output f, respectively, of the ALU to the North of the switching section 14. Also, the busses fe, hco, be are connected to the output f, output co and input b of the ALU, respectively, to the West of the switching section 14. Furthermore, the busses aw, hci, fw are connected to the input a, input ci and output f, respectively, of the ALU to the East of the switching section 14. Moreover, the busses fn, vci, an are connected to the output f, input ci and input a, respectively, of the ALU to the south of the switching section 14.

In addition to these connections, the busses vregw, vrege are connected via respective programmable switches 18 to 4-bit connection points vtsw, vtse, respectively, (shown by crosses in FIG. 2) in the area 12 of the ALU to the North of the switching section 14. Also, the busses hregs, hregn are connected via respective programmable switches 18 to 4-bit connection points htse, htne, respectively, in the area 12 of the ALU to the West of the switching section 14. Furthermore, the busses bregs, hregn are connected via respective programmable switches 18 to 4-bit connection points htsw, htaw, respectively, in the area 12 of the ALU to the East of the switching section 14. Moreover, the busses vregw, vrege are connected via respective programmable switches 18 to 4-bit connection points vtnw, vtne, respectively, in the area 12 of the ALU to the south of the switching section 14. These connection points vtnw, vtne, htne, htse, vtse, vtsw, htsw, htnw will be described below in further detail with reference to FIGS. 3 to 5.

Figure 9:
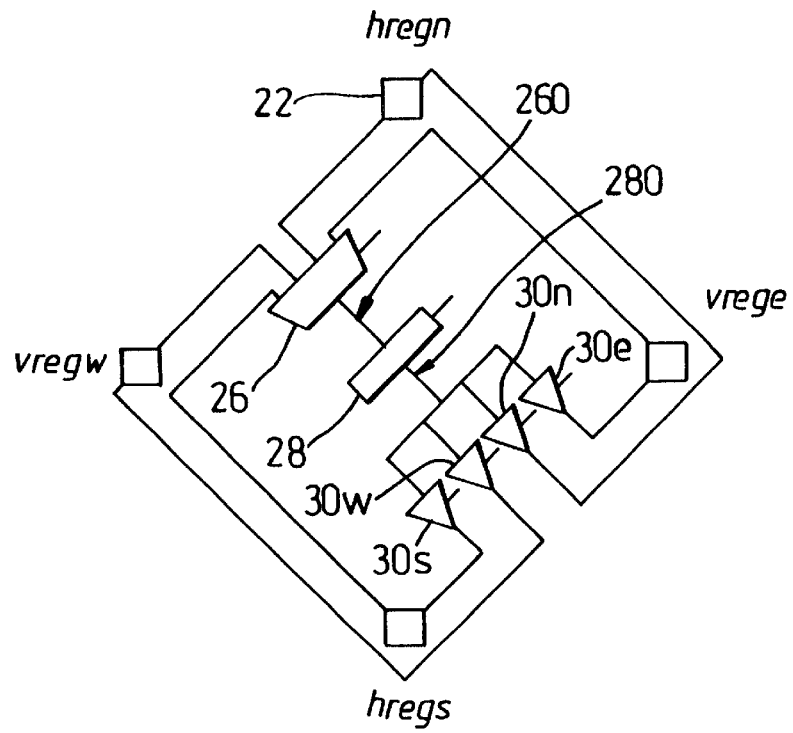
FIG. 9 shows a buffer and register which may be used in each switching section.

Also, as shown in FIG. 2, the busses hregn, vrege, hregs, vregw have respective 4-bit connection points 22 (shown by small squares in FIG. 2) which will be described below in further detail with reference to FIG. 9.

Figure 3:
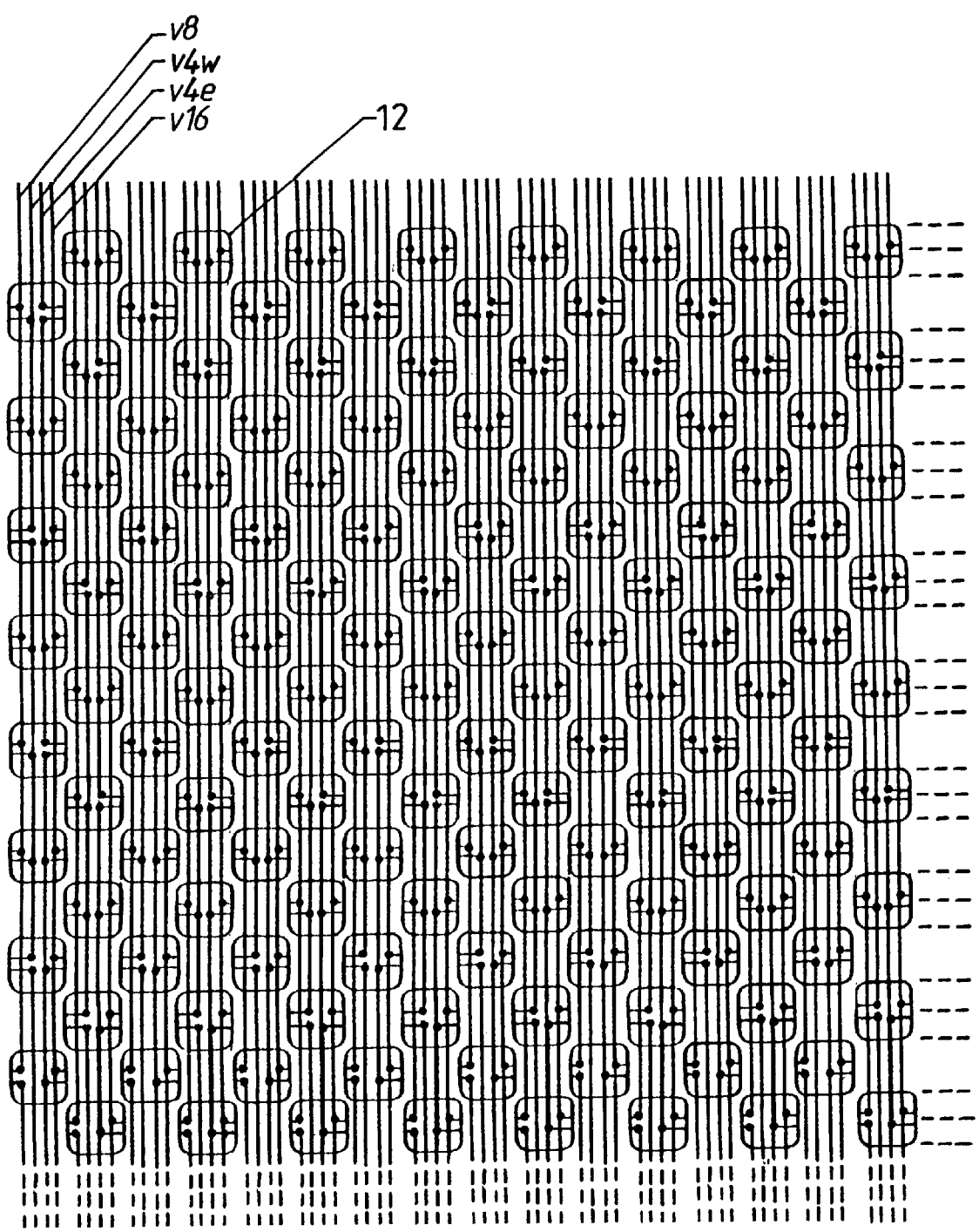
FIG. 3 shows part of the processor array shown in FIG. 1 on a smaller scale, illustrating the locations of the arithmetic logic units and "vertical" busses extending across them.

FIG. 3 shows one level of interconnections between the locations of the arithmetic logic units, which are illustrated by squares with rounded corners. A group of four 4-bit busses v8, v4w, v4e, v16 extend vertically across each column of ALU locations 12. The leftmost bus v8 in each group is in segments, each having a length generally of eight tiles. The leftmost but one bus v4w each group is in segments, each having a length generally of four tiles. The rightmost but one bus v4e in each group is in segments, again each having a length generally of four tiles, but offset by two tiles from the leftmost but one bus v4w. The rightmost bus v16 in each group is in segments, each having a length generally of sixteen tiles. At the top edge of the array, which is at the top of FIG. 4, and at the bottom edge the lengths of the segments may be slightly greater than or shorter than specified above.

Figure 5:
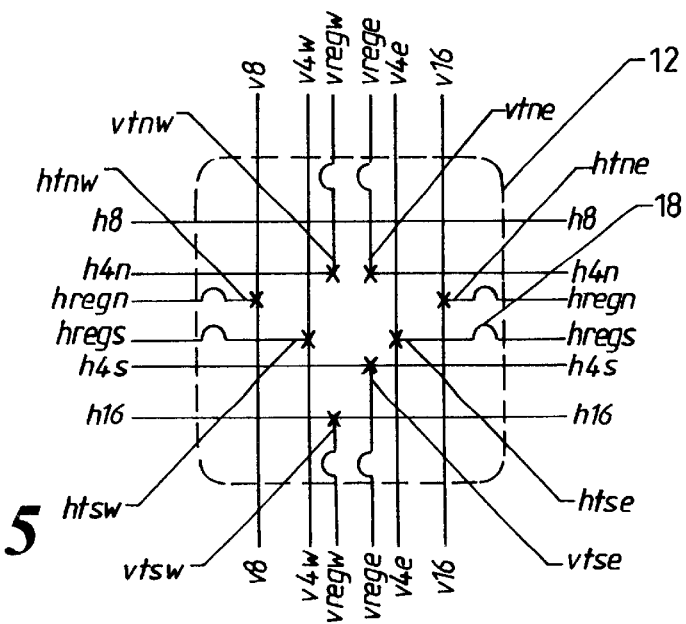
FIG. 5 shows the interconnections between the the busses of FIGS. 2, 3 and 4 at the location of one of the arithmetic logic units.

Referring to FIGS. 3 and 5, where each group of four busses v8, v4w, v4e, v16 crosses each ALU location 12, four 4-bit tap connections are made at the connection points htnw, htsw, htse, htne. The ends of the bus segments take priority in being so connected over a connection to a bus segment which crosses the ALU location.

Figure 4:
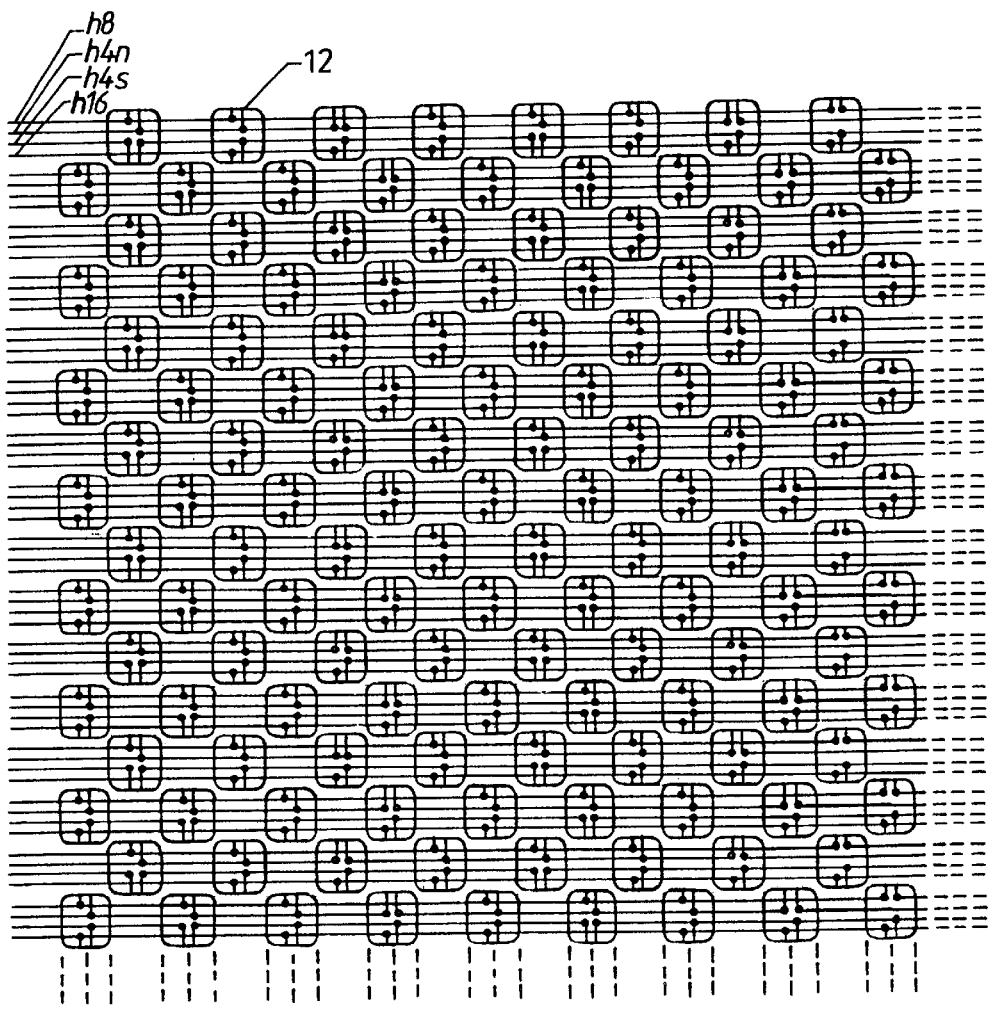
FIG. 4 is similar to FIG. 3, but illustrating "horizontal" busses extending across the locations of the arithmetic logic units.

Similarly, as shown in FIGS. 4 and 5, a group of four 4-bit busses h8, h4n, h4s, h16 extend horizontally across each row of ALU locations 12. The uppermost bus h8 in each group is in segments, each having a length generally of eight tiles. The uppermost but one bus h4n in each group is in segments, each having a length generally of four tiles. The lowermost but one bus h4s in each group is in segments, again each having a length generally of four tiles, but offset by two tiles from the uppermost but one bus h4n. The lowermost bus h16 in each group is in segments, each having a length generally of sixteen tiles. At the left hand edge of the array, which is at the left of FIG. 4, and at the right hand edge the lengths of the segments may be slightly greater than or shorter than specified above. Where each group of busses h8, h4n, h4s, h16 crosses each ALU location 12, a further four 4-bit tap connections are made at the connection points vtnw, vtsw, vtse, vtne. The ends of the bus segments take priority in being so connected over a connection to a bus segment which crosses the ALU location.

As shown in FIG. 5, the connection points htnw, htsw, htne, htse are connected via programmable switches to the busses hregn, hregs of the switching sections to the West and the East of the ALU location. Also, the connection points vtnw, vtne, vtsw, vtse are connected via programmable switches to the busses vregw, vrege of the switching sections to the North and the South of the ALU location.

The programmable connections 16 between pairs of 4-bit busses which cross at right angles will now be described with reference to FIG. 6A. The conductors of the horizontal busses are denoted as x0, x1, x2, x3, and the conductors of the vertical busses are denoted as y0, y1, y2, y3. Between each pair of conductors of the same bit significance, a respective transistor 160, 161, 162, 163 is provided. The gates of the transistors 160, 161, 162, 163 are connected in common to the output of a NOR gate 16g, which receives as its two inputs an inverted ENABLE signal from a single bit memory cell, which may be shared by a group of the switches, and the inverted content of a single bit memory cell 24. Accordingly, only when the ENABLE signal is high and the content of the memory cell 24 is high, the conductors x0, x1, x2, x3 are connected by the transistors 160, 161, 162, 163, respectively, to the conductors y0, y1, y2, y3, respectively.

The programmable connections 18 between pairs of 4-bit busses which meet each other end to end in line will now be described with reference to FIG. 6B. The conductors of one bus are denoted as x10, x11, x12, x13, and the conductors of the other bus are denoted as x20, x21, x22, x23. Between each pair of conductors of the same bit significance, a respective transistor 180, 181, 182, 183 is provided. The gates of the transistors 180, 181, 182, 183 are connected in common to the output of a NOR gate 18g, which receives as its two inputs an inverted ENABLE signal from a single bit memory cell, which may be shared by a group of the switches, and the inverted content of a single bit memory cell 24. Accordingly, only when the ENABLE signal is high and the content of the memory cell 24 is high, the conductors x10, x11, x12, x13 are connected by the transistors 180, 181, 182, 183, respectively, to the conductors x20, x21, x22, x23, respectively.

The programmable connections 20 between the carry conductors hco,vco,hci,vci will now be described with reference to FIG. 6C. The horizontal carry output conductor hco is connected to the horizontal carry input conductor hci and the vertical carry input conductor vci via transistors 20hh, 20hv, respectively. Furthermore, the vertical carry output conductor vco is connected to the vertical carry input conductor vci and the horizontal carry input conductor hci via transistors 20vv, 20vh, respectively. The gates of the transistors 20hh, 20vv are connected in common to the output of an inverter 20i, and the gates of the transistors 20hv, 20vh and the input to the inverter 20i are connected to the output of a NOR gate 20g. The NOR gate 20g receives as its two inputs an inverted ENABLE signal from a single bit memory cell, which may be shared by a group of the switches, and the inverted content of a single bit memory cell 24. Accordingly, when the ENABLE signal is high, the conductors hco, vco are connected to the conductors hci, vci, respectively, or to the conductors vci, hci, respectively, in dependence upon the content of the memory cell 24.

Figure 7:
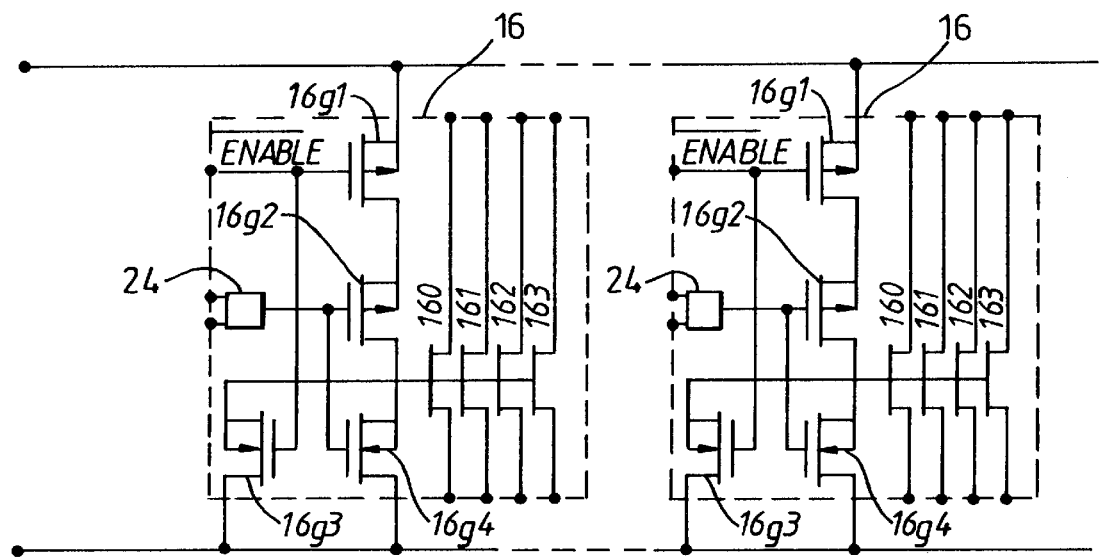
FIG. 7 shows the circuitry of a series of NOR gates which may be used in the programmable switches of FIGS. 5 and 6.
Figure 8:
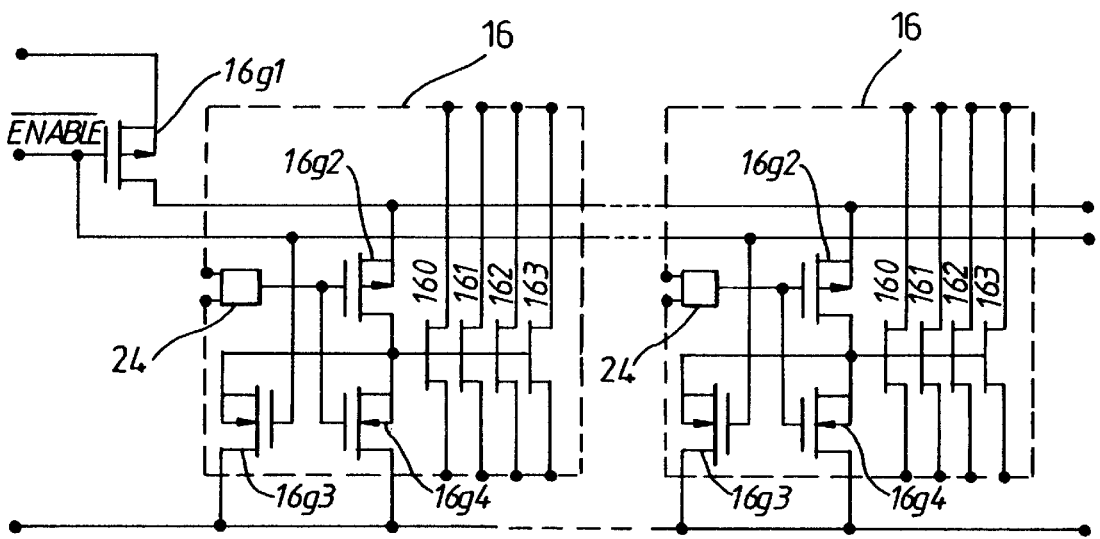
FIG. 8 shows a modification to the circuitry of FIG. 7.

It will be noted that each of the switchable connections 16, 18, 20 described with reference to FIGS. 6A to 6C includes a NOR gate 16g, 18g, 20g. As shown in FIG. 7, a NOR gate 16g is typically formed by four transistors 16g1, 16g2, 16g3, 16g4, two 16g1, 16g3 of which are responsive to the inverted ENABLE signal, and two 16g2, 16g4 of which are responsive to the inverted content of the memory cell 24. It is desirable that a group of the switchable collections 16, 18, 20 may be disabled in common, without any need for only part of such a group to be disabled. Such a group might consist of all of the switchable connections in one switching section 14, all of the switchable connections in the two switching sections 14 in a particular tile, or all of the switchable connections in a larger area of the array. In this case, the transistor 16g1 may be made common to all of the switchable connections 16, 18, 20 in the group, as shown in FIG. 8. This enables a 25% less one saving in the number of transistors required for the gates, but does require a further conductor linking the gate, as shown in FIG. 8.

Further simplification is possible, though not shown here, by using the properties of memory cell 24. Both the content and the complement of the content of this memory cell 24 are readily available as outputs. It can thus be seen that the circuit of FIG. 8, for example, can be lowered in wiring cost by using this property of memory cells 24 to obviate the need for carrying both the actual and inverted ENABLE signals, as with use of either actual or complement values from the memory cells, only one enable signal is required.

As mentioned above with reference to FIGS. 1 and 2, at each switching section 14, the busses bregn, hregs, vregw, vrege are connected by respective 4-bit connections 22 to a register or buffer circuit, and this circuit will now be described in more detail with reference to FIG. 9. The four connections 22 are each connected to respective inputs of a multiplexer 26. The multiplexer 26 selects one of the inputs as an output, which is supplied to a register or buffer 28. The output of the register or buffer 28 is supplied to four tri-state buffers 30s, 30w, 30n, 30e, which are connected back to the connections 22 to the busses hregs, vregw, bregn, vrege, respectively. In the case where a buffer 28 is used, the 4-bit signal on a selected one of the busses hregs, vregw, hregn, vrege is amplified and supplied to another selected one of the busses hregs, vregw, hregn, vrege. In the case where a register 28 is used, the 4-bit signal on a selected one of the busses hregs, vregw, hregn, vrege is amplified and supplied to any selected one of the busses hregs, vregw, hregn, vrege after the next active clock edge. Use of an enhanced form of this FIG. 9 structure renders it possible to extract a 4-bit signal on a selected one of the busses hregs, vregw, hregn and vrege for a different purpose from interbus routing. Appropriate construction and connection of multiplexer 26 (or in alternative arrangements, of buffer 28) allows selection of a value received from the wiring network as the output of the multiplexer 26 or buffer 28 (these choices being indicated as 260 and 280 respectively on FIG. 9), with that value then being used in determining the instruction of the ALU associated with that switchbox. The applications of this arrangement are discussed further below.

Use of the multiplexer 26 or buffer 28 for this purpose means that the value used for providing instruction to the ALU is also the value made available for passing onwards through the wiring network. A different switching section 14 has to be used if it is desired to pass a different value between wires. However, in many arrangements it will be desirable for the value passed to the ALU to determine its instruction also to be the value passed from one wire to another: this is appropriate where it is desired to provide the same instruction to a number of ALUs, which may occur often in a deep processing pipeline. An alternative embodiment, not shown, employs two or more pairs of multiplexers 26 and buffers 28: in this case, one multiplexer/buffer pair can be dedicated to provision of the instruction input for the associated ALU, whereas the other pair .or pairs can be used for routing.

It will be appreciated that the arrangement described above provides great flexibility in the routing of signals around and across the array. With appropriate setting of the switches 16, 18, 20 using the memory cells 24 and with appropriate setting of the multiplexers 26 and register s or buffers 28, signals can been sent over large distances, primarily using the busses v16, h16, v8, h18, v4e, v4w, h4n, h4s from the edge of the array to a particular ALU, between ALUs, and from a particular ALU to the edge of the array. These busses can be joined together in line, or at right angles, by the switching sections 14, with amplification by the registers or buffers 28 in order to reduce propagation delays, and with pipeline stages introduced by the registers 28. Also, these busses can be tapped part way along their lengths, so that the siting of the ALUs to perform a particular processing operation is not completely dictated by the lengths of the busses, and so that signals can be distributed to more than one ALU. Furthermore, the shorter length busses described with reference to FIGS. 1 and 2 can be used to route signals between the switching sections 14 and the ALUs, and to send signals primarily over shorter distances, for example from one ALU to an adjacent ALU in the same row or column, or diagonally adjacent, even though the busses extend horizontally or vertically. Again, the registers or buffers 28 can be used to amplify the signals or introduce programmable delays into them.

In the arrangement described above, the memory cells 24 are distributed across the array to the same extent as the switching sections 14 and the ALU locations 12. Each memory cell 24 is disposed adjacent the switch or switches, multiplexer, register or buffer which it controls. This enables a high circuit density be achieved.

Figure 10:
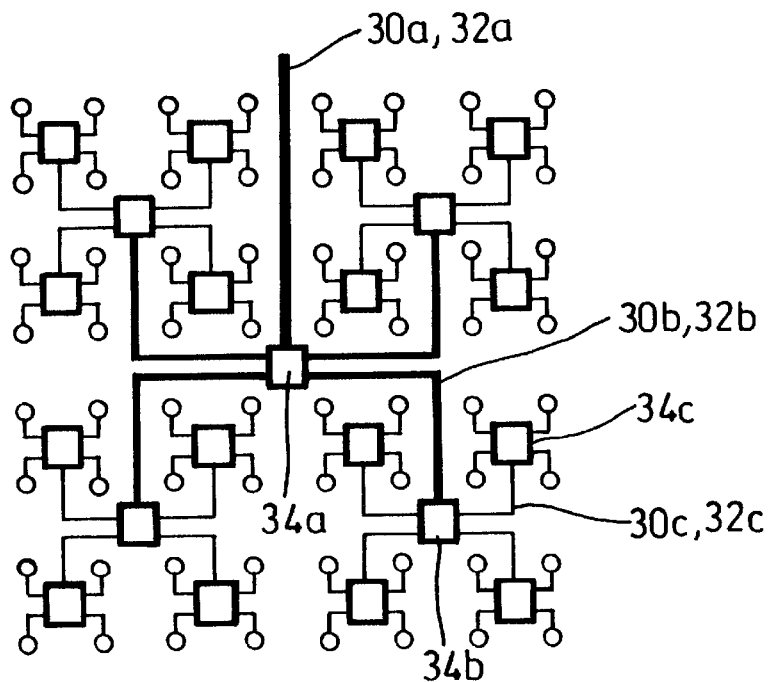
FIG. 10 is a schematic drawing illustrating how enable signals may be distributed to the programmable switches in the switching sections.
Figure 11:
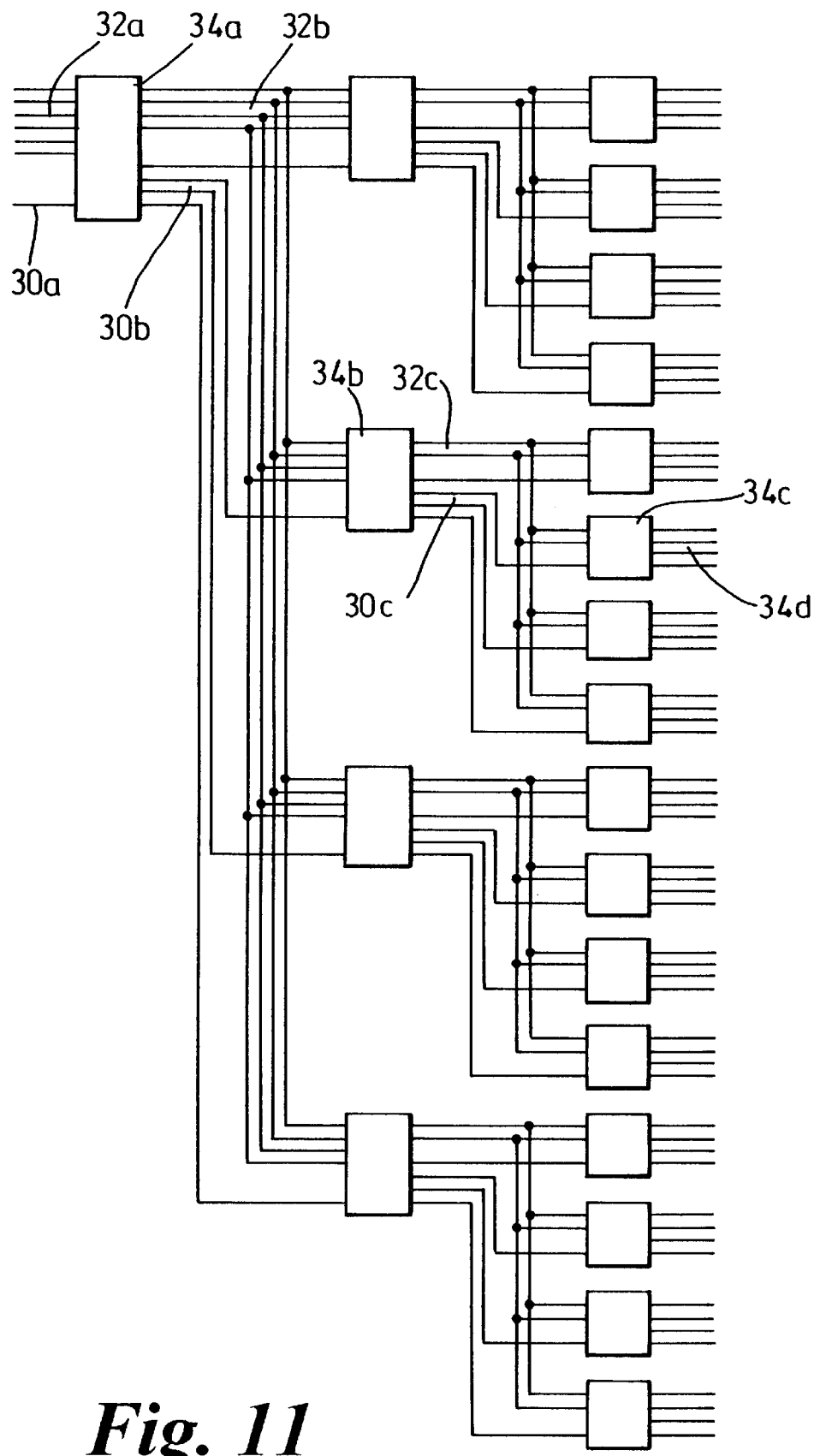
FIG. 11 shows in more detail the circuitry of the arrangement shown in FIG. 10.

A description will now be made of the manner in which data is written to or read from the memory cells 24, the way in which the ENABLE signals for the programmable switches 16, 18, 20 are written to their memory cells, the way in which instructions, and possibly constants, are distributed to the ALUs, and the way in which other control signals, such as a clock signal, are transmitted across the array. For all of these functions, an "H-tree" structure (which is known per se) may be employed, as shown in FIG. 10. Referring to FIGS. 10 and 11, in order to distribute an ENABLE signal to any of 64 locations in the example shown, the ENABLE signal 30a and a 6-bit address 32a for it are supplied to a decoder 34a. The decoder 34a determines which of the four branches from it leads to the address and supplies an ENABLE signal 30b to a further decoder 34b in that branch, together with a 4-bit address 32b to the decoders 34b in all four branches. The decoder 34b receiving the ENABLE signal 30b determines which of the four branches from it leads to the required address and supplies an ENABLE signal 30c to a further decoder 34c in that branch, together with a 4-bit address 32c to the decoders 34c in all four branches. The decoder 34c receiving the ENABLE signal 30c then supplies the ENABLE signal 34d to the required address where it can be stored in a single bit memory cell. An advantage of the H-tree structure is that the lengths of the signal paths to all of the destinations are approximately equal, which is particularly advantageous in the case of the clock signal.

A great advantage of the arrangement described above is that groups of the memory cells 24 in for example one switching section 14, or in the two switching sections in one tile, or in the switching sections in a sub-array of the tiles may be disabled en bloc by the inverted ENABLE signals so that the contents of those memory cells do not affect the associated switches. It is then possible for those memory cells 24 to be used as "user" memory by an application, rather than being used for configuring the wiring of the array.

Figure 12A:
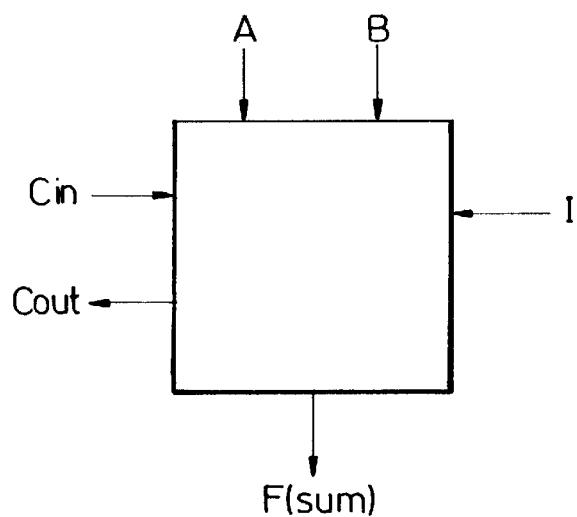
FIG. 12A shows a block diagram illustrating an individual arithmetic logic unit for use in the array of FIG. 1.

The structure .of the ALU used in this embodiment of the invention will now be described with reference to FIG. 12. As is shown in FIG. 12A, the ALU has four inputs, A, B, I, and $C_{in}$, and two outputs, F and $C_{out}$. A, B, I and F are all four bits wide and are connected to the general interconnect by the neighbouring switch blocks, as is described above for A, B and F. The input for I is extracted from multiplexer 26 shown in FIG. 9. $C_{in}$ and $C_{out}$ are both 1 bit wide, and are connected to a more restricted interconnect, also as described above. A and B provide the operands for the ALU, and F the output. $C_{in}$ and $C_{out}$ provide the carry function, but also have significance in control. I provides an instruction input which determines the functional operation of the ALU: this is in contrast to a standard FPGA, in which functional units are controlled by a set of memory bits. The significance of this feature, and the mechanisms provided for routing instruction inputs from the wiring network to the ALU, are discussed further below.

The ALU has four principal components:
- the ALU datapath, which consists of four identical bitslices;
- the instruction decoder;
- the carry/control input conditioning logic; and
- the switch block programming interface (in other embodiments of the invention, this need not be present in the ALU itself, however, the presence of this feature within the ALU allows the possibility of using the ALU in a look-up table mode).

Figure 12B:
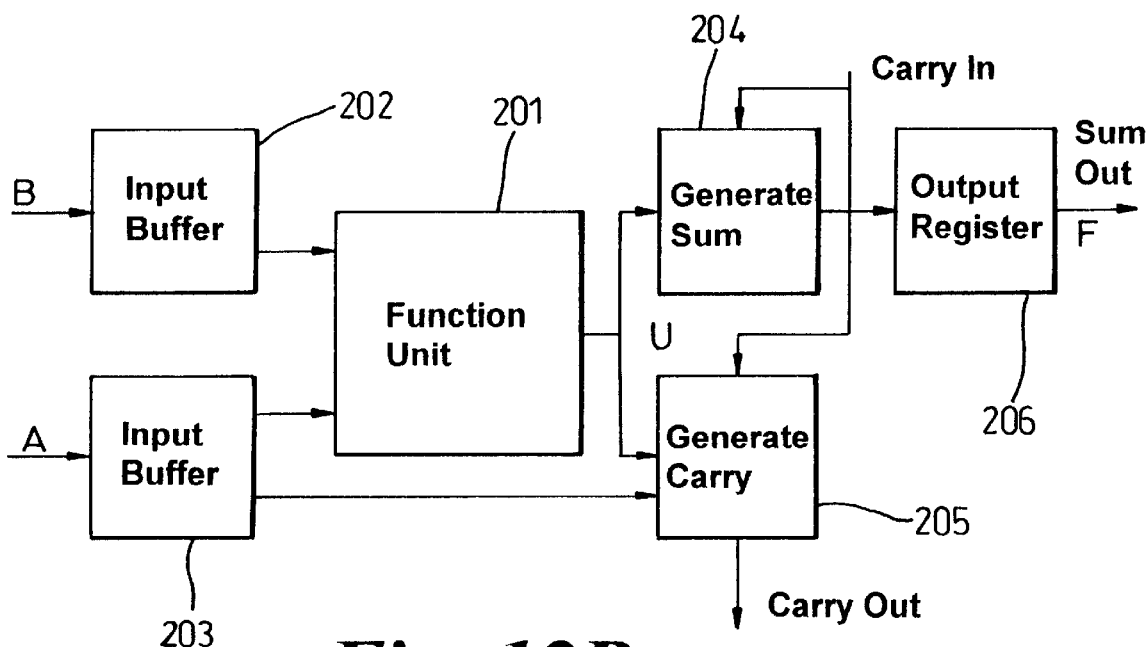
FIG. 12B shows schematically a bitslice of this individual arithmetic logic unit.

FIG. 12B shows a block diagram of a single bitslice of the ALU.

The two "input buffers" 202 and 203 are no more than a means of providing electrical connection to the routing network. There is no addressable input register (and hence register file) in this architecture: the operands are provided to the function unit 201 of the ALU from the same place (the wiring network) in each cycle.

Function unit 201 operates as a lookup table (LUT) which generates a boolean function, U, of the two inputs A and B. The precise function is set by four control signals ($L_3$, $L_2$, $L_1$, $L_0$) and generates the Karnaugh map shown in Table 1:

TABLE 1

Karnaugh map for ALU bitslice

| U= | A B | 0 | 1 |
|---|---|---|---|
| | 0 | $L_0$ | $L_1$ |
| | 1 | $L_2$ | $L_3$ |

The generation of the control signals $L_1$ is discussed further below. Generate sum 204 provides a sum output derived by an XOR of U and $C_{in}$:

Sum=U XOR $C_{in}$ $C_{out}$ is generated by generate carry 205 according to the following Boolean equations:

P=U OR $L_4$

G=A OR $L_5$ $C_{out}$=IF P THEN $C_{in}$ ELSE G where P can be considered as a propagate function and G as a generate function. The signals $L_i$ are again generated in a manner discussed further below.

The output register 206 optionally latches the sum output, this option being selectable under the control of the ALU programing memory. Optionally, a similar latching arrangement can be provided for the carry output. These features are advantageous for use in deep pipelines where the same operation may need to be performed synchronously or in time-controlled manner in several ALUs.

A wide variety of different possible bitslices can be employed. The choice of bitslice type selected in a given architecture may be a function of the type of instruction that the architecture as a whole is intended to process most efficiently. It is clearly desirable to enable the use of a variety of functions which can act as useful building blocks for more complex operations. Other features are also desirable. One desirable feature is the capacity to "divert" some bits from their normal function to allow control over other circuit elements. Another desirable feature is the capacity to store a fixed instruction for any ALUs which do not in a particular configuration require dynamic instruction switching. It is also desirable for there to be a suitable default state to allow for the ALU to be used as a read/write port for the switchbox (or look-up table).

Figure 12C:
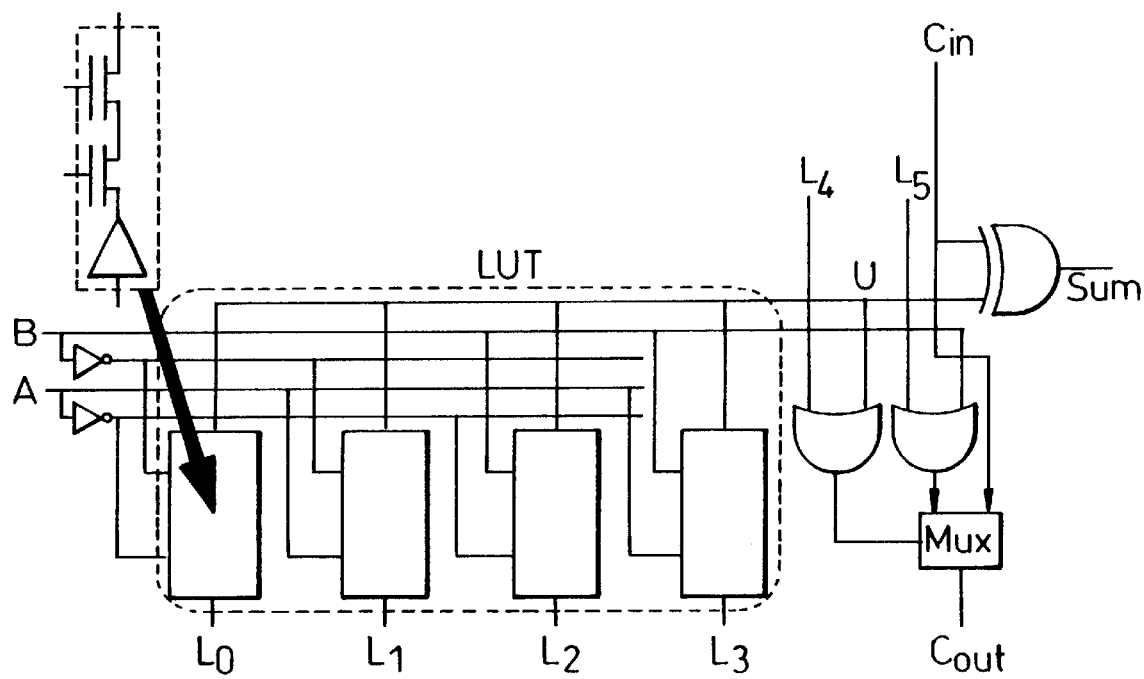
FIG. 12C shows a physical implementation of the bitslice of FIG. 12B, all according to one embodiment of the invention.

FIG. 12c shows a block diagram of a physical implementation of a single bitslice of the ALU. The inputs and outputs have been described above with respect to FIG. 12b. The bitslice requires that six control signals be generated: the mechanism for this is discussed further below. A useful set of logic functions generated by this bitslice is shown in Table 2 below:

TABLE 2

Functions for bitslice with associated control inputs

| | | | | | | CarryIn value | |
|---|---|---|---|---|---|---|---|
| $L_0$ | $L_1$ | $L_2$ | $L_3$ | $L_4$ | $L_5$ | 0 | 1 |
| 1 | 1 | 1 | 0 | 1 | 1 | A NAND B | A AND B |
| 0 | 1 | 1 | 1 | 1 | 1 | A OR B | A NOR B |
| 0 | 1 | 1 | 0 | 1 | 1 | A XOR B | A NXOR B |
| 0 | 1 | 0 | 0 | 1 | 1 | A AND $\overline{B}$ | $\overline{A}$ OR B |
| 0 | 0 | 1 | 0 | 1 | 0 | $\overline{A}$ AND B | A OR $\overline{B}$ |
| 1 | 1 | 0 | 0 | 1 | 1 | NOT B | B |
| 0 | 0 | 1 | 1 | 1 | 0 | B | NOT B |
| 1 | 0 | 1 | 0 | 1 | 0 | NOT A | A |
| 0 | 1 | 0 | 1 | 1 | 1 | A | NOT A |
| 0 | 1 | 1 | 0 | 0 | 0 | ADD | |
| 1 | 0 | 0 | 1 | 0 | 0 | SUB | |
| 1 | 0 | 0 | 1 | 0 | 1 | A EQUALS B | |
| 1 | 1 | 1 | 0 | 0 | 0 | MATCH1 | |
| 1 | 1 | 1 | 0 | 0 | 0 | MATCH0 | |

The inputs fall into the following groups: arithmetic instructions (ADD, SUB), two-input bitwise instructions (AND, OR, NOR, XOR, NXOR), one input instructions (A, B, NOT A, NOT B) and comparison and test instructions (EQUALS, MATCH1, MATCH0). The outputs of these functions are summarised in Table 3 below.

TABLE 3

Outputs for instructions

| Name | Sum function | $C_{out}$ function |
|---|---|---|
| ADD | A plus B | Arithmetic carry |
| SUBA | A minus B | Arithmetic carry |
| A AND B | =$A_i$ AND $B_i$ | $C_{out} = C_{in}$ |
| A OR B | =$A_i$ OR $B_i$ | $C_{out} = C_{in}$ |
| A NOR B | =NOT ($A_i$ OR $B_i$) | $C_{out} = C_{in}$ |
| A XOR B | =$A_i$ XOR $B_i$ | $C_{out} = C_{in}$ |
| A NXOR B | =NOT ($A_i$ XOR $B_i$) | $C_{out} = C_{in}$ |
| A AND $\overline{B}$ | =$A_i$ AND (NOT $B_i$) | $C_{out} = C_{in}$ |
| B AND $\overline{A}$ | =(NOT $A_i$) AND $B_i$ | $C_{out} = C_{in}$ |

TABLE 3-continued

Outputs for instructions

| Name | Sum function | $C_{out}$ function |
|---|---|---|
| $\overline{A}$ OR B | =(NOT $A_i$) OR $B_i$ | $C_{out} = C_{in}$ |
| $\overline{B}$ OR A | =$A_i$ OR (NOT $B_i$) | $C_{out} = C_{in}$ |
| A | =$A_i$ | $C_{out} = C_{in}$ |
| B | =$B_i$ | $C_{out} = C_{in}$ |
| NOT A | =NOT $A_i$ | $C_{out} = C_{in}$ |
| NOT B | =NOT $B_i$ | $C_{out} = C_{in}$ |
| A EQUALS B | Not applicable | if A == B then 0, else 1 |
| MATCH1 | Not applicable | bitwise AND of A and B, followed by OR across width of the word |
| MATCH0 | Not applicable | bitwise OR of A and B, followed by an AND across the width of the word |

2 s complement arithmetic is used, and the arithmetic carry is provided to be consistent with this arithmetic. The MATCH functions are so-called because for MATCH1 the value of 1 is only returned if there is at least one position that is 1 in both A and B, whereas for MATCH0 the value of 0 is only returned if there is at least one position that is 0 in both A and B.

Six control signals $L_i$ are required to determine the outputs of the bitslice. However, it is desirable that any dynamic instruction to determine the function of the ALU contain no more than 4 bits, so that it can fit on the 4 bit pathways of the interconnect and so that an ALU instruction can be provided as the output of another ALU. One scheme for deriving control signals $L_i$ from four instruction bits $Ji$ is as follows:

$L_0 = J_3$ $L_1 = (J_1 \text{ OR } \overline{J}_0) \text{ AND } (J_3 \text{ NAND } J_2)$ $L_2 = (\overline{J}_1 \text{ OR } J_0) \text{ AND } (J_3 \text{ NAND } J_2)$ $L_3 = J_2$ $L_2 = (\overline{J}_1 \text{ OR } \overline{J}_0) \text{ AND } (J_3 \text{ NAND } J_2)$ $L_5 = J_0$ However, this has a drawback in that it provides no multiplexer controlled only by $C_{in}$. To achieve this, the definitions of $L_0$ and $L_3$ can be changed to give some dependence on $C_{in}$. The other definitions are unchanged.

$L_0 = \text{IF } (C_{in} \text{ AND } L_4) \text{ THEN } J_2 \text{ ELSE } J_3$ $L_3 = \text{IF } (C_{in} \text{ AND } L_4) \text{ THEN } J_3 \text{ ELSE } J_2$ The resulting instruction table is shown below as Table 4.

TABLE 4

Instruction bits and corresponding functions

| | | | | | | | | | | CarryIn value | |
|---|---|---|---|---|---|---|---|---|---|---|---|
| $J_3$ | $J_2$ | $J_1$ | $J_0$ | $L_0$ | $L_1$ | $L_2$ | $L_3$ | $L_4$ | $L_5$ | 0 | 1 |
| 0 | 0 | 0 | 0 | 0 | 1 | 1 | 0 | 1 | 1 | XOR | NXOR |
| 0 | 0 | 0 | 1 | 0 | 0 | 1 | 0 | 1 | 0 | $\overline{A}$ AND B | A OR $\overline{B}$ |
| 0 | 0 | 1 | 0 | 0 | 1 | 0 | 0 | 1 | 1 | A AND $\overline{B}$ | $\overline{A}$ OR B |
| 0 | 0 | 1 | 1 | 0 | 1 | 1 | 0 | 0 | 0 | ADD | |
| 0 | 1 | 0 | 0 | $C_{in}$ | 1 | 1 | $\overline{C}_{in}$ | 1 | 1 | A OR B | A AND B |
| 0 | 1 | 0 | 1 | | 0 | 1 | | 1 | 0 | B | A |

TABLE 4-continued

Instruction bits and corresponding functions

| $J_3$ | $J_2$ | $J_1$ | $J_0$ | $L_0$ | $L_1$ | $L_2$ | $L_3$ | $L_4$ | $L_5$ | CarryIn value 0 | 1 |
|---|---|---|---|---|---|---|---|---|---|---|---|
| 0 | 1 | 1 | 0 | | 1 | 0 | | 1 | 1 | A | B |
| 0 | 1 | 1 | 1 | 0 | 1 | 1 | 1 | 0 | 0 | MATCH0 | |
| 1 | 0 | 0 | 0 | $\overline{C_{in}}$ | 1 | 1 | $C_{in}$ | 1 | 1 | A NAND B | A NOR B |
| 1 | 0 | 0 | 1 | | 0 | 1 | | 1 | 0 | NOT A | NOT B |
| 1 | 0 | 1 | 0 | | 1 | 0 | | 1 | 1 | NOT B | NOT A |
| 1 | 0 | 1 | 1 | 1 | 1 | 1 | 0 | 0 | 0 | MATCH1 | |
| 1 | 1 | 0 | 0 | 1 | 0 | 0 | 1 | 0 | 1 | | |
| 1 | 1 | 0 | 1 | 1 | 0 | 0 | 1 | 0 | 0 | | |
| 1 | 1 | 1 | 0 | 1 | 0 | 0 | 1 | 0 | 1 | A EQUALS B | |
| 1 | 1 | 1 | 1 | 1 | 0 | 0 | 1 | 0 | 0 | SUB | |

Figure 16:
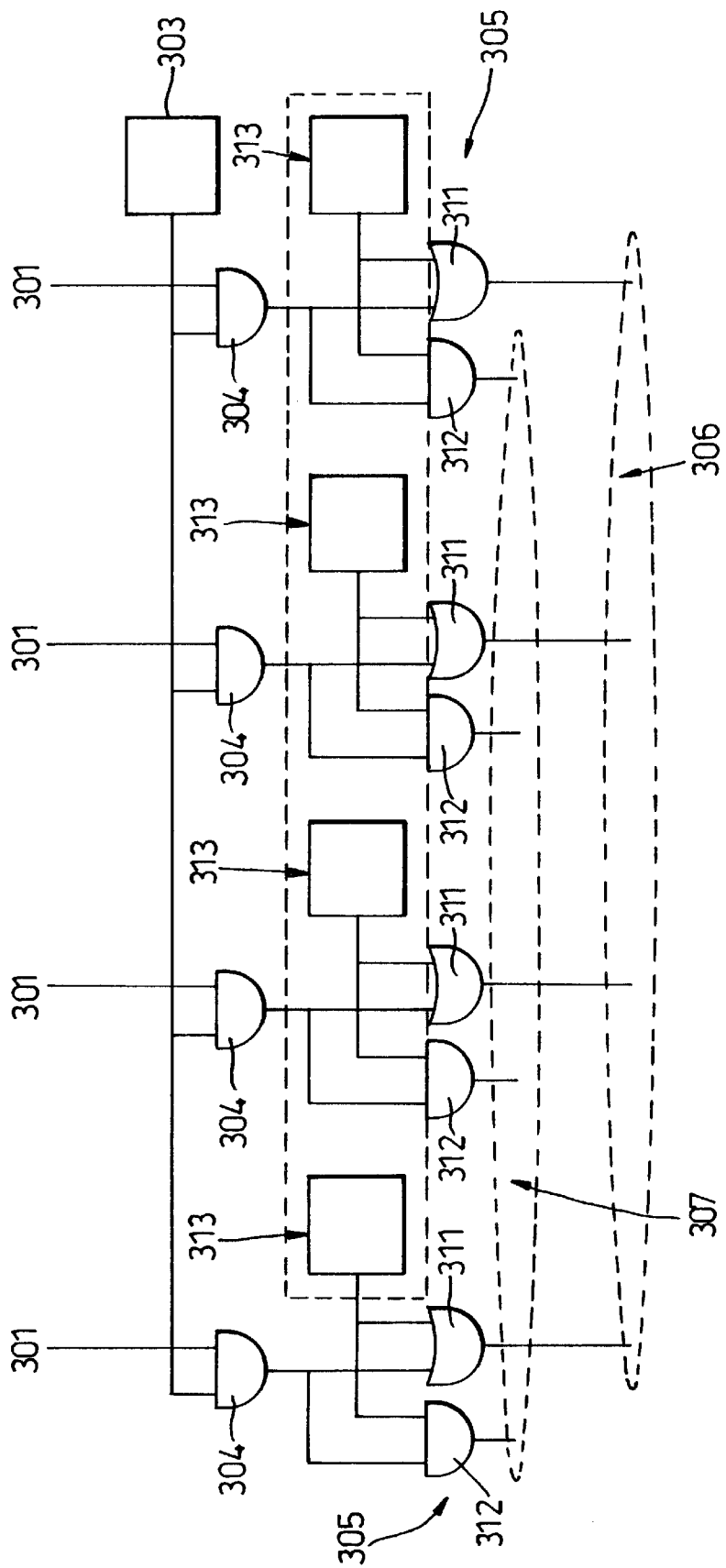
FIG. 16 shows a structure for feeding instructions dynamically from the wiring network into an arithmetic logic unit.

The provenance of the instruction bits for the ALU will now be discussed. An element of the present invention, in at least one aspect thereof, which is shared with the MATRIX architecture is the ability to generate an instruction for a functional unit as the output of another functional unit. In the MATRIX architecture, this is achieved in a structure with relatively coarse functional units, each comprising an 8-bit ALU and input registers with their own register files. In the present embodiment, much finer-grained functional units are used comprising 4-bit ALUs and without addressable input registers. The lack of input registers requires functional units to operate in a processing pipeline. Circuitry which enables instructions to be input to the ALU from the wiring network in such a pipeline computation model is shown in FIG. 16.

Input signals containing dynamic instructions I (4-bit instructions generated by another ALU in the array, or optionally obtained from a memory accessible to the wiring network) are received from connections 301 to the wiring network: these can be obtained through multiplexer 26 (see FIG. 9) as indicated above. If it is desired that there be multiple choices available, this can be achieved by using one or more additional ALUs in multiplexer configurations.

In other embodiments of the architecture, all instructions may be provided dynamically, in which case the signal may pass directly into the ALU. However, in the embodiment shown there is an option as to whether instructions are provided dynamically or locally. The signals input from the wiring network pass through a dynamic instruction enable gate 304. The function of this gate is to enable either dynamic instruction bits I to be used by that ALU or to prevent them from being used, in which case stored instruction bits need to be used instead. This is determined by a single bit 303 of configuration RAM for that ALU. If dynamic instruction bits are to be used, gate 304 passes the values of I input from the wiring network. If not, then the output of gate 304 will be zero, and the instruction input to the ALU will be that which has already been stored as stored instruction bits in a 4-bit control register 313. Such stored instruction bits could for example have been loaded earlier through the H-tree network.

Advantages can be obtained if the mechanism to provide input to the ALU as dynamic instruction bits I from the wiring network 301 or as stored instruction bits from register 313 is provided in the form of a dynamic instruction mask 305. This contains two gates, an OR gate 311 and an AND gate 312. The inputs to each gate are the same—the output of dynamic instruction enable gates 304 and the register 313.

The output of the OR gate 311 is the relevant instruction bit $J_i$. The output of the AND gate 312 is available as outputs $K_i$ for provision to other parts of the ALU, for reasons discussed further below. If input enable bit 303 is low, then all the outputs $K_i$ are low, and the instruction bits $J_i$ for the bitslice follow the 4-bit control register 313. If the input enable bit 303 is high and a control register 313 bit is low, then the external input $I_i$ is routed to the associated output for instruction bit $J_i$ and the associated $K_i$ is forced low. If the input enable bit 303 is high and a control register 313 bit is high, then the external input $I_i$ is routed to the associated $K_i$ and the associated output for instruction bit $J_i$ is forced high.

Figure 17:
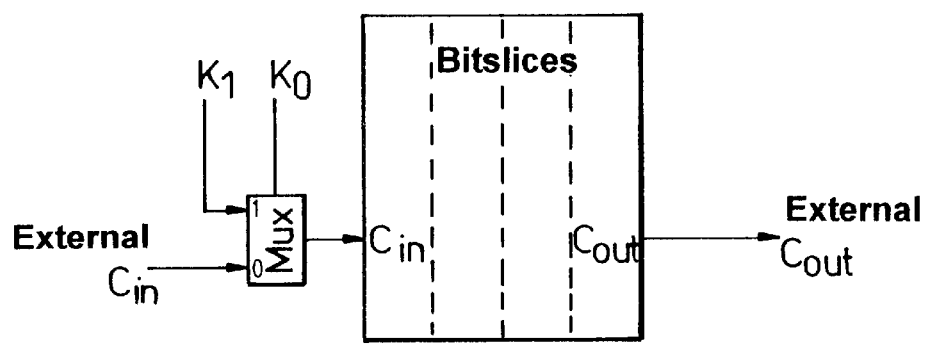
FIG. 17 shows a carry input/output path utilising diversion of bits with a dynamic instruction mask as illustrated in FIG. 16.

The advantage of providing the dynamic instruction mask 305 is that in order to make effective use of dynamic instructions, it will often be desirable to control other circuitry synchronously with the ALU. For example, in certain cases if an ALU is to be swapped between addition and subtraction operations, then the constant fed into the least significant bit of the carry chain needs to be set to 1 for subtraction and 0 for addition. Provision of dynamic instruction mask 305 obviates the need for additional control inputs to control this peripheral circuitry, as is shown in FIG. 17. The mask circuitry allows certain bits of the dynamic instruction input to be fed to the ALU, and other bits of the dynamic instruction input to be fed to the peripheral circuitry.

In the case shown in FIG. 17, the control register 313 has the value 0011. The effect of this is that $I_3$ and $I_2$ connect to $J_3$ and $J_2$ respectively, but $I_1$ and $I_0$ connect to $K_1$ and $K_0$. $J_1$ and $J_0$ are both fixed to a value of 1. This gives an extended set of ADD and SUB instruction codes which include ADD_LSB and SUB_LSB codes adapted to handle the least significant bits. The resulting codes for I to achieve this set of function codes are:

| I input ADD instruction code | 0000 |
|---|---|
| I input ADD_LSB instruction code | 0001 |
| I input SUB instruction code | 1100 |
| I input SUB_LSB instruction code | 1111 |

The ALU instruction codes J will be the same (0011) for both ADD and ADD_LSB, but for ADD $C_{in}$ is simply propagated to be $C_{in}$ for the bitslice, whereas for ADD_LSB the value of $C_{in}$ for the bitslice is always 0. The position for the SUB instructions is similar: for SUB_LSB the value of $C_{in}$ for the bitslice is always 1.

The combination of ALU instructions that can be used at the same time as the peripheral circuitry is controlled by the dynamic instruction input is thus constrained. However, this does not cause any practical difficulty, as only a limited number of cases need to be covered. For example, the case illustrated in FIG. 17 requires there to be two common bits between the ADD and SUB instructions: in this case bits $J_1$ and $J_0$ which both have a value of 1

Figure 13:
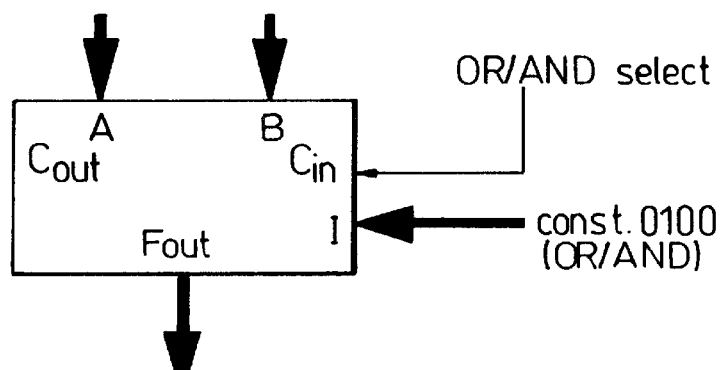
FIG. 13 shows dynamic instruction selection between OR and AND in an arithmetic logic unit.
Figure 14:
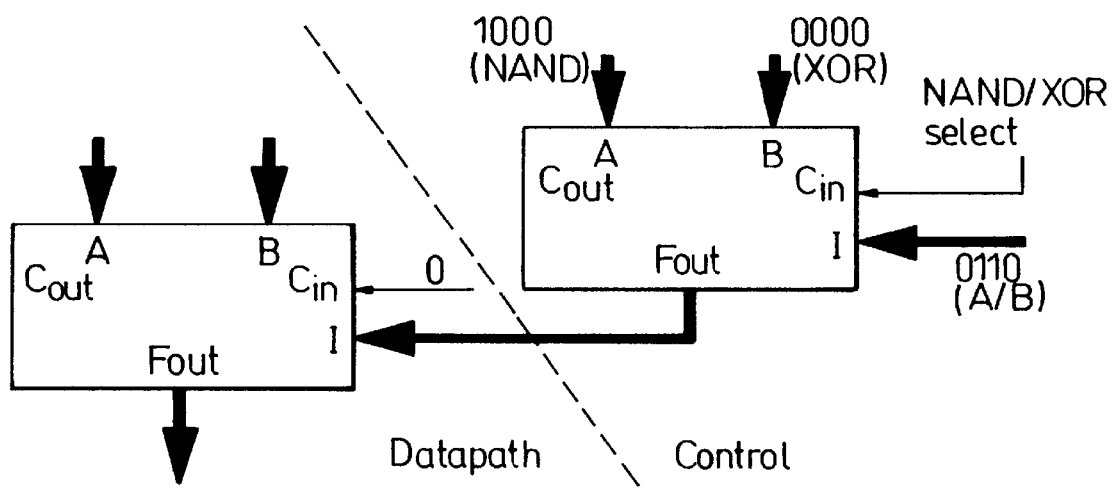
FIG. 14 shows dynamic instruction selection between NAND and XOR in a pair of arithmetic logic units.

The 4-bit output of an ALU can thus be used as a dynamic instruction input I for another ALU. The carry output of an ALU can also be used as the carry input for another ALU, and this can be exploited in the provision of dynamic instructions. There are three basic ways in which the operation of an ALU can be varied dynamically:

1. $C_{in}$ can be used to multiplex between two versions of a function, with the instruction bits I remaining constant. An example is shown in FIG. 13, which shows multiplexing between OR and AND. This allows multiplexing between functions shown adjacent in the two right hand columns in Table 4.
2. The instruction bits I can be changed while $C_{in}$ remains the same. This allows swapping between functions in the same column of the instruction table which have the same requirements for $C_{in}$: for example between NAND and XOR, which have instruction inputs 1000 and 0000 respectively with carry input $C_{in}$=0. In practice, this will be most readily achieved as shown in FIG. 14, with a second ALU used to multiplex between the two instructions. The two I values are used as A and B inputs for the first ALU, which is programmed with the multiplexing function 0110, and the output is provided as I input to the second ALU.

Figure 15:
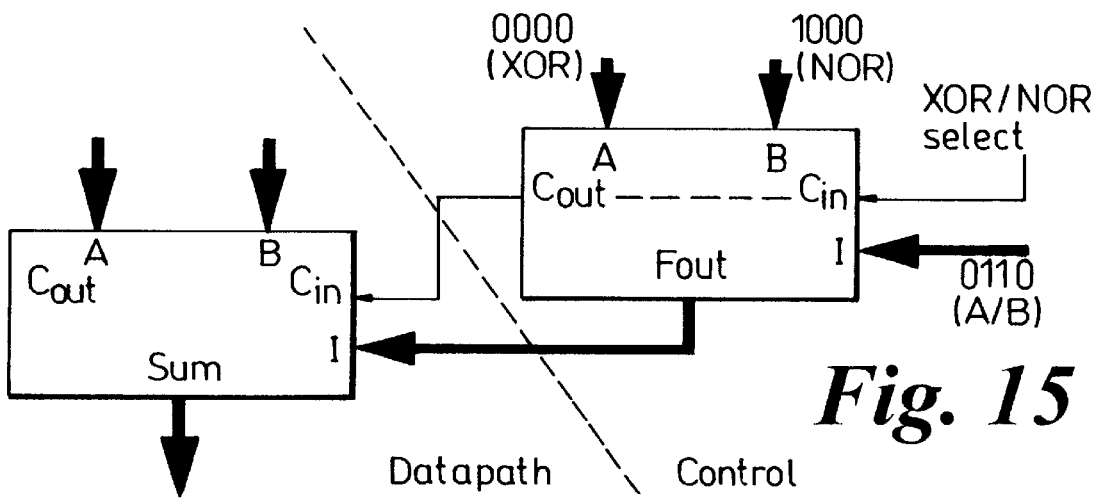
FIG. 15 shows dynamic instruction selection between XOR and NOR in a pair of arithmetic logic units.

3. Both the instruction and the value of $C_{in}$ can be changed. This allows swapping between any two entries in the two right hand columns of the instruction table. FIG. 15 shows this arrangement, which is similar to that of FIG. 14 in that it employs a first ALU as a multiplexer and a second ALU which is given the instruction chosen at the multiplexer as its I input. In this case the functions are XOR, with instruction code 0000, and NOR, with instruction code 1000: the values of $C_{in}$ required are 0 and 1 respectively. The signal used as $C_{in}$ of the multiplexing ALU to select between the alternative instruction inputs is here propagated as $C_{out}$ of the multiplexing ALU and used as $C_{in}$ of the second ALU, and the required combination of I and $C_{in}$ results.

As previously indicated, look up table operation is possible as the ALU contains the memory interface logic for the adjacent switch block. An ALU and switch block pair can thus be converted into a 4-input, 4-output look up table (LUT). The LUT address is taken from the A input, so the sum output can be any arbitrary boolean function of A. This may be useful for instructions that cannot be implemented efficiently with the ALU instruction set (possible examples would be parity generation, bit rotation, and the matching of complex patterns in a CASE statement). LUT operation is selectable by a mode bit within the ALU and cannot in this embodiment be selected by an I input.

During LUT operation of an ALU, the I input is disabled. Optionally, writes to the memory can be allowed during LUT operation, in which case B is used as the data input and $C_{in}$ used as write enable. The LUT output can be used to drive the output of the ALU in the normal way.

The basic mode of a processor in this processor array is to perform one of a predetermined set of logic operations on two or three inputs. In the simplest case, the instruction performed by a processor is programmed statically into 4 bits of configuration memory, and the instruction does not change between successive clock cycles. However, as shown above, it is possible for dynamic instructions to be provided also: the instruction that determines the operation of each processor is then formed as a logical combination of the 4 bits of configuration memory together with a 4 bit input taken from the general wiring network. The function of the relevant processor (or part of the array) can then be changed cycle-by-cycle, saving the cost of full reconfigurations, increasing the number of instructions that can be provided, and decreasing the cost of data dependent operation.

Figure 18:
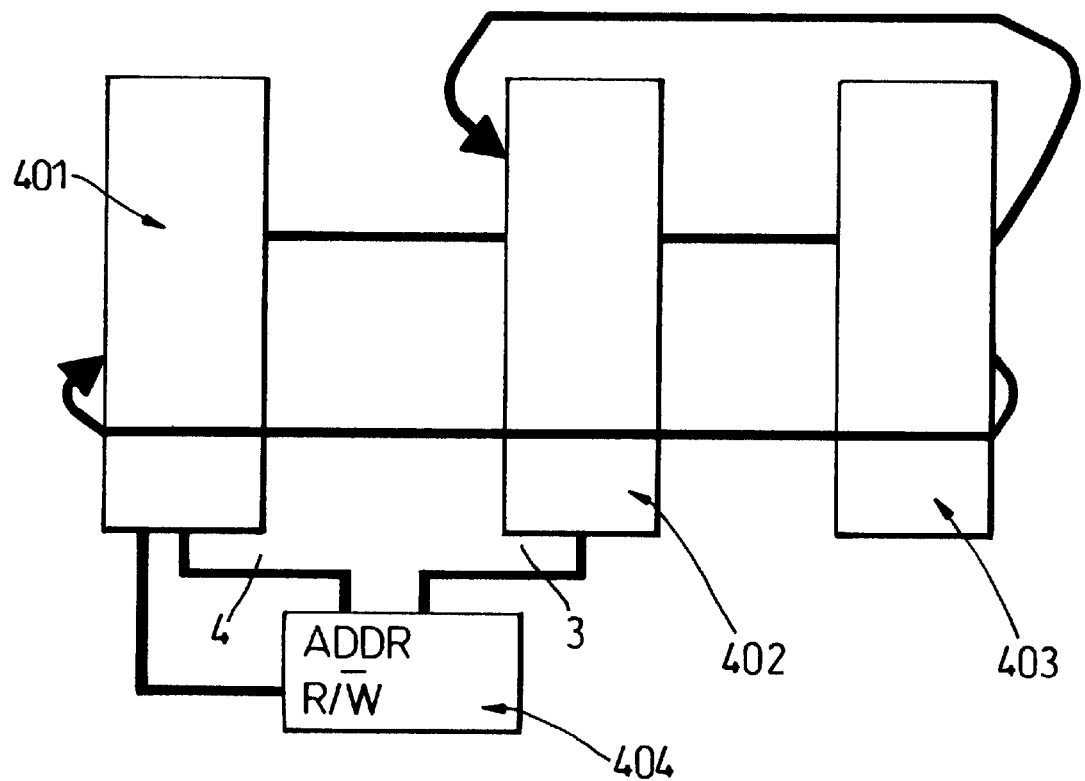
FIG. 18 depicts an example of a bitslice of a very simple CPU

As dynamic instructions can be provided to a processor element, and as user plane memory is available (in the case of this array, by conversion of configuration memory to user plane memory), it is found to be possible to build a CPU within the processor array. An example of a bitslice of a very simple CPU is shown in FIG. 18. It should be noted that far more complex bitslices are also possible, the bitslice of FIG. 18 being the simplest constructable. It comprises a memory such as RAM 401 (which may, for example, be a configuration memory converted to user plane memory), the arithmetic logic unit (ALU) 402 of a processor element, the output register 403 of the processor element, and a code memory 404, which will generally also be RAM (and again could be one or more processor elements converted to user plane memory). RAM 401 has dimensions of 16 words by 4 bits. This CPU is adapted to work on a 4 bit wide slice of data, as this is the bitslice that can be handled by the processor element. For a required datapath width of greater than 4 bits, one or more additional processor elements will be required.

RAM 401 acts as a register file for the CPU, and holds data for the CPU. Instructions for the CPU are received from the code memory 404. These instructions are of two kinds: instructions for the ALU 402 itself, and address and read/write control for the RAM 401 (address information passing from and address port, shown as ADDR, through 4 dedicated wires, and read/write control through a separate port shown as R/W). Advantageously, this instruction information will be held in a compressed form in code memory 404, in which case an additional instruction decoder will be required between the code memory 404 and the CPU. The instruction performed by the ALU 402 has a result, which is stored in the output register 403. This result may in the next cycle be fed back to the ALU 402, or may be stored in RAM 401: in a single cycle, there may be either one read from, or one write to, RAM 401.

A simple instruction set appropriate for this CPU is the following (where REG is register 403, RAM is RAM 401, and addr is the address to RAM 401):

| | |
|---|---|
| REG := RAM(addr) | load word number (addr) from RAM 401 into REG |
| REG := NOT RAM(addr) | load logical inverse of RAM(addr) into REG |
| REG := REG NAND RAM(addr) | do a bitwise logical NAND of the values in REG and RAM(addr), store result in REG |
| REG := REG AND NOT RAM(addr) | do a bitwise logical AND of the value in REG and the logical inverse of the value in RAM(addr), store result in REG |
| REG := REG + RAM(addr) | do an arithmetic addition of the values in REG and RAM(addr), store result in REG |
| REG := REG OR RAM(addr) | do a bitwise logical OR of the values in REG and RAM(addr), store result in REG |
| RAM(addr) := REG | allowing the register file to be written. |

It is straightforward to construct a CPU with a more complex datapath slice, optimised for specific types of operation, with the functional units available. The number of ALUs required is dependent on the instruction set required for the CPU—it will generally be desirable for the minimum number of ALUs necessary to implement the required instruction set to be used, subject to timing constraints. If additional registers are required, it is straightforward to construct these from one or more 16 word by 4 bit RAMs (similar to RAM 401). If there are a number of ALUs within a datapath slice, it is necessary for each to be driven with instruction values on their instruction inputs that cause them to compute the required instruction jointly.

There may be more than one datapath slice. In this case, it is advantageous for corresponding ALUs in each slice to share instruction inputs from a common code memory: if instructions are compressed in the common code memory, then decompressed instructions can be provided to each ALU through a shared instruction decoder. Carries will be chained from least significant to most significant datapath slice for each individual ALU that implements instructions using the carry chain.

There are a number of ways available for generating the instruction stream for a CPU of this type. The most straightforward is as indicated in FIG. 18: the stream of instructions is read in from a memory. However, it is also possible for instructions to be derived from data values, with consequent data dependent execution. The most versatile arrangement will employ a combination of both these methods.

The embodiment of the invention has been described merely by way of example, and many modifications and developments may be made in keeping with the present invention. For example, the embodiment employs 4-bit ALUs as the processing units, but other forms of ALU or other processing units may additionally or alternatively be used.

Furthermore, the embodiment has been described as if the whole array is covered by ALUs and switching sections. However, other types of section may be included in the array. For example, a sub-array might be composed of a 4×4 arrangement of tiles of ALUs and switching sections as described above, and the array might be composed of such sub-arrays and memory in a 4×4 array, or such sub-arrays and RISC CPUs in a 4×4 array.

In the embodiment described above, each ALU location is square, and each switching section is square and of the same size as the ALU locations, but it should be noted that the controllable switches 18 in the register busses vregw, vrege, hregn, hregs encroach into the square outline of the ALU locations. The ALU locations need not be of the same size as the switching sections, and in particular may be smaller, thus permitting one or more busses to pass horizontally or vertically directly from one switching section 14 to a diagonally adjacent switching section 14, for example running between the busses h2s, h2n or between the busses v2e, v2w.

In the embodiment described above, each ALU has two independent carry inputs vci, hci and a connected pair of carry outputs co. If required, the ALUs may be arranged to deal with two types of carry: a fast carry between adjacent ALUs which may be of particular use for multi-bit adding operations; and a slow carry which can be routed more flexibly and may be of particular use for digital serial arithmetic. The fast carry might be arranged in a similar manner to that described above with reference to the drawings, whereas the slow carry might employ programmable switches in the switching sections 14 between the carry conductor and particular bits of the 4-bit busses.

In the embodiment described above; particular bit widths, sizes of switching section and sizes of array have been mentioned, but it should be noted that all of these values may be changed as appropriate. Also, the programmable switches 16, 18, 20 have been described as being disposed at particular locations in each switching section 14, but other locations may be used as required and desired.

In the embodiment described above, the array is two-dimensional, but the principles of the invention are also applicable to three-dimensional arrays, for example by providing a stack of the arrays described above, with the switching sections in adjacent layers staggered with respect to each other. The stack might include just two layers, but preferably at least three layers, and the number of layers is preferably a power of two.

In the embodiment described above, the memory cells 24 can be isolated by the gates 16g, 18g, 20g from the switches which they control so that the memory cells can be used for other purposes, that is put in the "user plane". The ENABLE signal memory cells, however, cannot be transferred to the user plane. In an alternative embodiment, the switches in a particular switching section 14 may be disconnectable from the remainder of the array by further switches in the busses at the boundary of that switching section 14, with the further switches being controlled by a further memory cell which cannot be transferred to the user plane.

Many other modifications and developments may also be made.

What is claimed is:

1. A reconfigurable device comprising:
   a plurality of processing devices;
   a connection matrix providing an interconnect between the processing devices; and
   means to define a configuration of the connection matrix;
   wherein each of the processing devices comprises an arithmetic logic unit adapted to perform a function on input operands and produce an output, wherein said input operands are provided as inputs to the arithmetic logic unit from the interconnect on the same route in each cycle, and wherein the connection matrix is adapted to direct the output of a first one of the processing devices to a second one of the processing devices to determine the function performed by the second one of the processing devices.

2. A reconfigurable device as claimed in claim 1, wherein each of the processing devices contains no addressable input register, whereby input operands are received directly from the interconnect by the arithmetic logic unit.

3. A reconfigurable device as claimed in claim 1, wherein each of the processing devices has a first plurality of configuration bits which can be determined by the output of another one of the processing devices and a second plurality of configuration bits which cannot be determined by the output of another one of the processing devices.

4. A reconfigurable device as claimed in claim 1, wherein each of the processing devices has a first operand input, a second operand input, a function result output, a carry input and a carry output, wherein the first operand input, the second operand input and the function result output are n-bit, where n is an integer greater than 1, and the carry input and the carry output are 1-bit.

5. A reconfigurable device as claimed in claim 4, wherein n is equal to 4.

6. A reconfigurable device as claimed in claim 4, wherein each of the processing devices is adapted to receive, for determination of its function, an n-bit instruction input from another of the processing devices.

7. A reconfigurable device as claimed in claim 4, wherein means are provided to allow the carry input to one of the processing devices to change the function of the arithmetic logic unit of that processing device.

8. A reconfigurable device as claimed in claim 7, wherein said means allows the carry input to change the function of the arithmetic logic unit to its logical complement.

9. A reconfigurable device as claimed in claims 4, wherein means are provided for each of the processing devices to enable the carry input to be held at a constant value.

10. A reconfigurable device as claimed in claim 4, wherein a first one of the processing devices is usable to multiplex between two values of an instruction input to a second one of the processing devices according to the value of the carry input of the first of the processing devices.

11. A reconfigurable device as claimed in claim 10, wherein the carry input of the first of the processing devices can be propagated through the first of the processing devices to the carry input of the second of the processing devices.

12. A reconfigurable device as claimed in claim 1, wherein each of the processing devices comprises a latchable output register for the function output.

13. A reconfigurable device as claimed in claim 1, wherein each of the processing devices comprises a dynamic enable gate to determine whether instructions to determine the function of the arithmetic logic unit are to be accepted dynamically from the interconnect or are to be provided from configuration memory in the processing device.

14. A reconfigurable device as claimed in claim 1, wherein each of the processing devices comprises a dynamic instruction mask whereby application of the dynamic instruction mask to an instruction received by the processing device enables the instruction to provide both an instruction input to the arithmetic logic unit for determining the function of the arithmetic logic unit and a peripheral circuitry instruction input for control of peripheral circuitry in the processing device.

15. A method of constructing a central processing unit from a reconfigurable device, the reconfigurable device comprising a plurality of processing devices, a connection matrix providing an interconnect between the processing devices; and means to define a configuration of the connection matrix, the method comprising:

allocating one or more of the processing devices to form an arithmetic logic unit of the central processing unit, wherein each of the processing devices comprises an arithmetic logic unit adapted to perform a function on input operands and produce an output, and wherein said input operands are provided as inputs to the arithmetic logic unit from the interconnect on the same route in each cycle;

associating a first memory, as a register file, with the arithmetic logic unit of the central processing unit; and associating a second memory, as a code memory, with the arithmetic logic unit of the central processing unit, to provide instructions for the central processing unit, wherein instruction inputs for the arithmetic logic unit of the central processing unit are provided from the second memory.

16. A method as claimed in claim 15, wherein either or both of the first memory and the second memory are provided by reconfiguration of one or more parts of the reconfigurable device into memory available for use by the central processing unit configured onto the reconfigurable device.

17. A method as claimed in claim 16, wherein the one or more parts of the reconfigurable device comprise parts of the means to define the configuration of the connection matrix.

18. A method as claimed in claim 15, wherein the central processing unit has multiple arithmetic logic units, and wherein instructions for the multiple arithmetic logic units are provided from the second memory.

19. A method as claimed in claim 15, wherein instruction decoder circuitry is provided between the second memory and both the first memory and the arithmetic logic unit of the central processing unit, such that instructions may be stored in compressed form in the second memory and may be decoded by the instruction decoder circuitry before execution in the central processing unit.

20. A method as claimed in claim 19, wherein the central processing unit has multiple arithmetic logic units, wherein instructions for the multiple arithmetic logic units are provided from the second memory, and wherein common instruction decoder circuitry is provided for the multiple arithmetic logic units.

21. A method as claimed in claim 15, wherein each of the processing devices contains no addressable input register.

22. A method as claimed in claim 15, wherein each of the processing devices has a first plurality of configuration bits which can be determined by the output of another one of the processing devices and a second plurality of configuration bits which cannot be determined by the output of another one of the processing devices.

23. A method as claimed in claim 15, wherein each of the processing devices has a first operand input, a second operand input, a function result output, a carry input and a carry output, wherein the first operand input, the second operand input and the function result output are n-bit, where n is an integer greater than 1, and the carry input and the carry output are 1-bit.

24. A method as claimed in claim 23, wherein n is equal to 4.

25. A method as claimed in claim 23, wherein each of the processing devices is adapted to receive, for determination of its function, an n-bit instruction input from another of the processing devices.

26. A method as claimed in claim 23, wherein means are provided to allow the carry input to one of the processing devices to change the function of the arithmetic logic unit of that processing device.

27. A method as claimed in claim 26, wherein said means allows the carry input to change the function of the arithmetic logic unit to its logical complement.

28. A method as claimed in claim 23, wherein means are provided for each of the processing devices to enable the carry input to be held at a constant value.

29. A method as claimed in claim 23, wherein a first one of the processing devices is usable to multiplex between two values of an instruction input to a second one of the processing devices according to the value of the carry input of the first of the processing devices.

30. A method as claimed in claim 29, wherein the carry input of the first of the processing devices can be propagated through the first of the processing devices to the carry input of the second of the processing devices.

31. A method as claimed in claim 15, wherein each of the processing devices comprises a latchable output register for the function output.

32. A method as claimed in claim 15, wherein each of the processing devices comprises a dynamic enable gate to determine whether instructions to determine the function of the arithmetic logic unit are to be accepted dynamically from the interconnect or are to be provided from configuration memory in the processing device.

33. A method as claimed in claim 15, wherein each of the processing devices comprises a dynamic instruction mask whereby application of the dynamic instruction mask to an instruction received by the processing device enables the instruction to provide both an instruction input to the arithmetic logic unit for determining the function of the arithmetic logic unit and a peripheral circuitry instruction input for control of peripheral circuitry in the processing device.

* * * * *

UNITED STATES PATENT AND TRADEMARK OFFICE
CERTIFICATE OF CORRECTION

PATENT NO. : 6,353,841 B1
DATED : March 5, 2002
INVENTOR(S) : Marshall et al.

It is certified that error appears in the above-identified patent and that said Letters Patent is hereby corrected as shown below:

Title page,
Item [56], OTHER PUBLICATIONS, "Yeung, A.K., et al" reference, please change "PADD12" to -- PADDI2 --.

Column 1,
Line 55, please change "being-concentrated" to -- being concentrated --.

Column 2,
Lines 48 and 53, please change "Andre" to -- André --.

Column 6,
Line 49, please add new paragraph before "At Y=2,".

Column 8,
Line 6, please change "bregs" to -- hregs --.
Line 8, please change "htaw" to -- htnw --.

Column 9,
Lines 14 and 15, please change "conductor s" to -- conductors --.

Column 10,
Lines 17 and 26, please change "bregn" to -- hregn --.
Line 66, please change "register s" to -- registers --.

Column 11,
Line 65, please change ".of" to -- of --.

Column 12,
Line 50, please add new paragraph before "Generate".

Column 13,
Line 65, please change "A AND B" to -- A AND $B$ --.

Column 14,
Line 19, please change "2 s" to -- 2s --.
Line 32, change "Ji" to -- $J_i$ --.

UNITED STATES PATENT AND TRADEMARK OFFICE
CERTIFICATE OF CORRECTION

PATENT NO. : 6,353,841 B1
DATED : March 5, 2002
INVENTOR(S) : Marshall et al.

It is certified that error appears in the above-identified patent and that said Letters Patent is hereby corrected as shown below:

Column 16,
Line 25, please change "0011" to -- 0011 --.

Column 17,
Line 3, please change "1000" and "0000" to -- 1000 -- and -- 0000 --.
Line 9, change "0110" to -- 0110 --.

Column 18,
Line 15, please change "4" to -- 4 --.

Column 19,
Line 48, please change "above;" to -- above, --.

Signed and Sealed this

Twenty-ninth Day of July, 2003

JAMES E. ROGAN
*Director of the United States Patent and Trademark Office*